United States Patent
Tanaka et al.

(10) Patent No.: US 9,985,622 B2
(45) Date of Patent: May 29, 2018

(54) COMPARATOR, SOLID-STATE IMAGING DEVICE, ELECTRONIC APPARATUS, AND DRIVING METHOD

(71) Applicant: Sony Corporation, Tokyo (JP)

(72) Inventors: Hideki Tanaka, Fukuoka (JP); Shizunori Matsumoto, Kanagawa (JP); Haruhisa Naganokawa, Kanagawa (JP); Yuuichi Kaji, Kanagawa (JP)

(73) Assignee: Sony Corporation, Tokyo (JP)

( * ) Notice: Subject to any disclaimer, the term of this patent is extended or adjusted under 35 U.S.C. 154(b) by 385 days.

(21) Appl. No.: 14/208,734

(22) Filed: Mar. 13, 2014

(65) Prior Publication Data

US 2014/0291482 A1    Oct. 2, 2014

(30) Foreign Application Priority Data

Mar. 29, 2013    (JP) .................................. 2013-072326

(51) Int. Cl.
*H03K 5/24* (2006.01)
*H04N 5/378* (2011.01)

(52) U.S. Cl.
CPC .......... *H03K 5/2481* (2013.01); *H04N 5/378* (2013.01)

(58) Field of Classification Search
CPC ...... H03K 5/2418; H03K 5/2481; H03K 5/24; H04N 5/378; H04N 5/335; H04N 5/3745; H04N 5/363

(Continued)

(56) References Cited

U.S. PATENT DOCUMENTS 7,336,214 B2 * 2/2008 Krymski ............. H03M 1/0607
                                                    250/208.1
8,179,465 B2 * 5/2012 Tanaka ................... H04N 5/365
                                                    348/294

(Continued)

FOREIGN PATENT DOCUMENTS

| JP | H11-112305 A | 4/1999 |
| JP | 2001-238132 | 8/2001 |
| JP | 2011-229120 | 11/2011 |

OTHER PUBLICATIONS

Japanese Office Action dated Jun. 2, 2015 for corresponding Japanese Application No. 2013-072326.

(Continued)

*Primary Examiner* — Kevin Pyo
*Assistant Examiner* — Don Williams
(74) *Attorney, Agent, or Firm* — Michael Best & Friedrich LLP

(57) ABSTRACT

A comparator includes: a first amplifying unit that includes a differential pair configured with a pair of transistors which are first and second transistors, and amplifies a difference of signals input to each of the gate electrodes of the first and second transistors, to output; a second amplifying unit that amplifies the signal output from the first amplifying unit; a third transistor that connects the first transistor to a power source voltage; a fourth transistor that connects the second transistor to the power source voltage; a fifth transistor that connects a connection point of gate electrodes of the third transistor and the fourth transistor to a drain of the third transistor; and a sixth transistor that connects a connection point of gate electrodes of the third transistor and the fourth transistor to a drain of the fourth transistor.

20 Claims, 18 Drawing Sheets

(58) Field of Classification Search
USPC ............. 250/214 R, 214 A, 214 LA, 214 LS, 250/214 C; 330/2, 5, 136, 200, 252, 253; 348/294–312
See application file for complete search history.

(56) References Cited

U.S. PATENT DOCUMENTS

| | | |
|---|---|---|
| 2007/0139242 A1 | 6/2007 | Krymski |
| 2009/0128653 A1 | 5/2009 | Tanaka |
| 2011/0156673 A1* | 6/2011 | Kim ........................ G05F 1/575 323/280 |
| 2013/0009800 A1 | 1/2013 | Yang et al. |
| 2013/0193595 A1 | 8/2013 | Scorrano et al. |

OTHER PUBLICATIONS

Chinese Office Action dated Jan. 26, 2017 for corresponding Chinese Application No. 201410108462.5.

\* cited by examiner

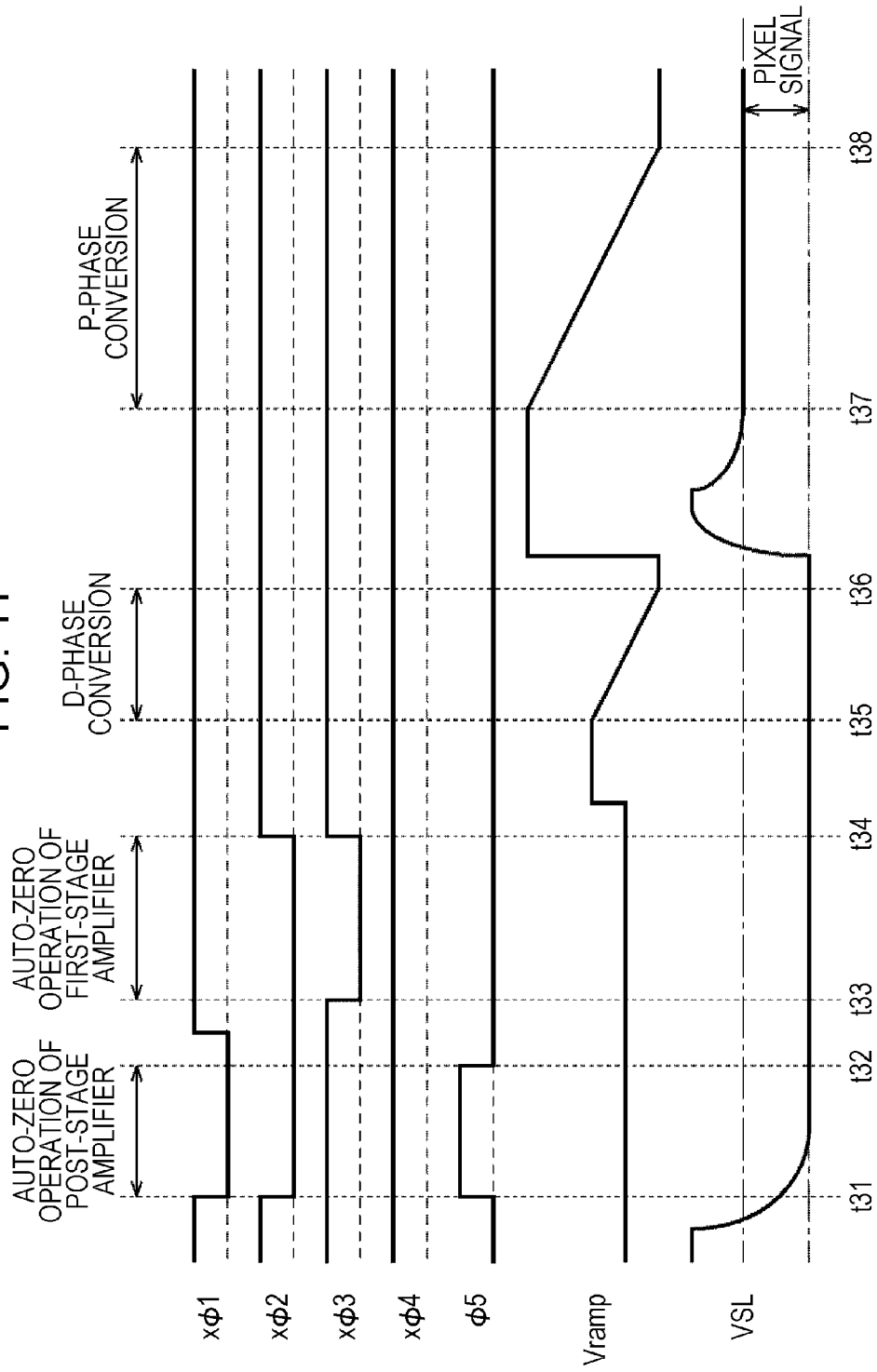

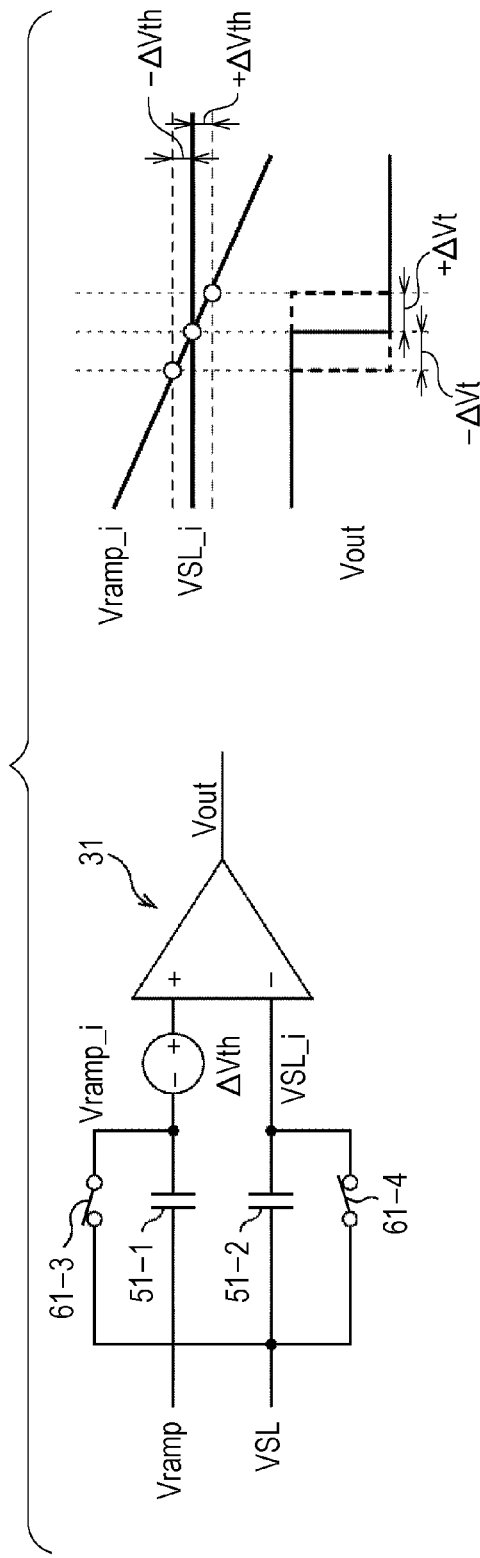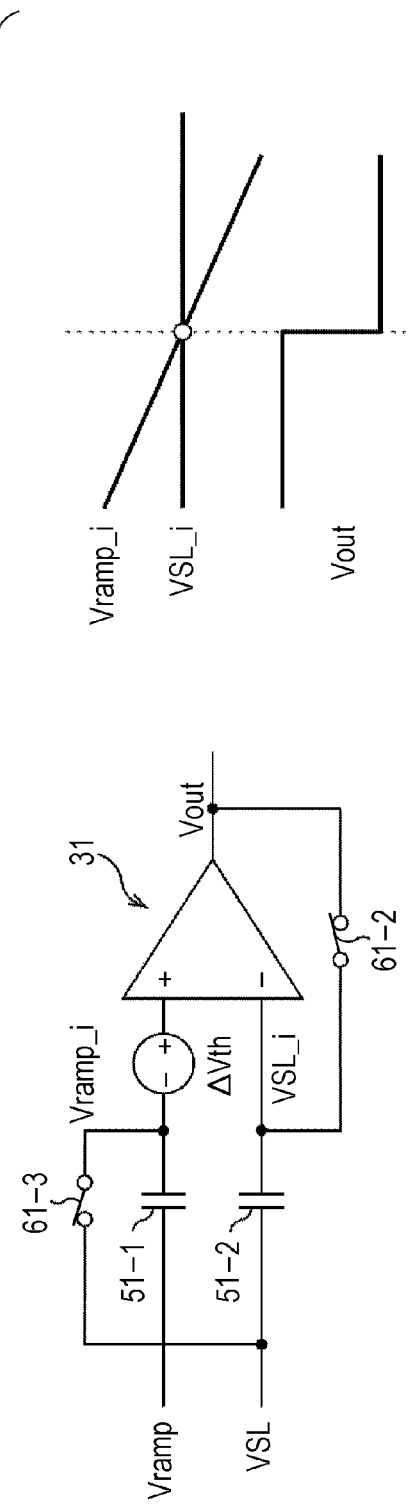

COMPARATOR, SOLID-STATE IMAGING DEVICE, ELECTRONIC APPARATUS, AND DRIVING METHOD

CROSS REFERENCE TO RELATED APPLICATIONS

This application claims the benefit of Japanese Priority Patent Application JP 2013-072326 filed Mar. 29, 2013, the entire contents of which are incorporated herein by reference.

BACKGROUND

The present disclosure relates to a comparator, a solid-state imaging device, an electronic apparatus, and a driving method, and particularly to a comparator, a solid-state imaging device, an electronic apparatus, and a driving method with which a speed of AD conversion processing can be increased.

In the related art, in an electronic apparatus that includes an imaging function such as a digital still camera and a digital video camera, for example, a solid-state imaging device such as a complementary metal oxide semiconductor (CMOS) image sensor or a charge coupled device (CCD) is used. The solid-state imaging device includes a pixel in which a photo diode that performs a photoelectric conversion and a plurality of transistors are combined, and an image is built based on pixel signals output from the plurality of pixels disposed in a plane.

For example, in the solid-state imaging device, charges accumulated in the photo diode are transferred to a floating diffusion (FD) unit that has a predetermined capacitance and is provided on the connection unit between the photo diode and a gate electrode of an amplifier transistor. Then, a signal corresponding to a level of the charges kept in the FD unit is read out from the pixel, and is analog digital (AD) converted by an AD conversion circuit which has a comparator, and then, is output.

In the solid-state imaging device, as a signal processing for removing a pixel-specific noise, for example, a correlated double sampling processing is performed with respect to the pixel signal output from the pixel. In the correlated double sampling processing, a signal (P-phase) with a level in which the charges accumulated in the FD unit is reset and a signal (D-phase) with a level in which the charges generated in the photo diode are kept in the FD unit, are sampled. Then, the noise can be removed by obtaining a difference of each sampled value.

In the CMOS image sensor, in a case where simultaneity of a shutter closing is retained, the charges are transferred in full batch from the photo diode to the FD unit, and thereafter, the pixel signal is sequentially read out. In this case, a driving of reading the D-phase (signal level) first and the P-phase (reset level) next (hereafter, appropriately referred to as a D-phase first-read drive) is performed (for example, refer to Japanese Unexamined Patent Application Publication No. 2001-238132).

For example, in Japanese Unexamined Patent Application Publication No. 2011-229120, in a comparator circuit which performs the D-phase first-read drive, a solid-state imaging device having a configuration in which an external initial voltage is applied for setting (adjusting) an internal node such that the comparator can operate in accordance with the D-phase signal level, is disclosed.

SUMMARY

However, in the configuration of the solid-state imaging device in Japanese Unexamined Patent Application Publication No. 2011-229120, on the inside of the AD conversion circuit, it is necessary to perform an automatic zero operation twice, and thus, it is difficult to increase a speed of the AD conversion processing.

In the present disclosure, it is desirable to increase the speed of the AD conversion processing.

According to an embodiment of the present disclosure, there is provided a comparator that includes: a first amplifying unit that includes a differential pair configured with a pair of transistors which are first and second transistors, and amplifies a difference of signals input into each of the gate electrodes of the first and second transistors, to be output; a second amplifying unit that amplifies the signal output from the first amplifying unit; a third transistor that connects the first transistor to a power source voltage; a fourth transistor that connects the second transistor to the power source voltage; a fifth transistor that connects a connection point of gate electrodes of the third transistor and the fourth transistor to a drain of the third transistor; and a sixth transistor that connects a connection point of gate electrodes of the third transistor and the fourth transistor to a drain of the fourth transistor.

According to another embodiment of the present disclosure, there is provided a solid-state imaging device that includes a pixel that outputs a pixel signal having a signal level corresponding to charges generated by a photoelectric conversion; and a column processing unit in which conversion units that convert the pixel signal output from the pixel to a digital signal are arrayed in parallel corresponding to the number of columns of the pixels. A comparator included in the conversion unit includes a first amplifying unit that includes a differential pair configured with a pair of transistors which are first and second transistors, and amplifies a difference of signals input to each of the gate electrodes of the first and second transistors, to output; a second amplifying unit that amplifies the signal output from the first amplifying unit; a third transistor that connects the first transistor to a power source voltage; a fourth transistor that connects the second transistor to the power source voltage; a fifth transistor that connects a connection point of gate electrodes of the third transistor and the fourth transistor to a drain of the third transistor; and a sixth transistor that connects a connection point of gate electrodes of the third transistor and the fourth transistor to a drain of the fourth transistor.

According to still another embodiment of the present disclosure, there is provided an electronic apparatus that includes a solid-state imaging device having a pixel that outputs a pixel signal having a signal level corresponding to charges generated by a photoelectric conversion, and a column processing unit in which conversion units that convert the pixel signal output from the pixel to a digital signal are arrayed in parallel corresponding to the number of columns of the pixels. A comparator included in the conversion unit includes: a first amplifying unit that includes a differential pair configured with a pair of transistors which are first and second transistors, and amplifies a difference of signals input to each of the gate electrodes of the first and second transistors, to output; a second amplifying unit that amplifies the signal output from the first amplifying unit; a third transistor that connects the first transistor to a power source voltage; a fourth transistor that connects the second transistor to the power source voltage; a fifth transistor that connects a connection point of gate electrodes of the third transistor and the fourth transistor to a drain of the third transistor; and a sixth transistor that connects a connection point of gate electrodes of the third transistor and the fourth transistor to a drain of the fourth transistor.

According to still another embodiment of the present disclosure, there is provided a driving method that includes a comparator that includes a first amplifying unit that includes a differential pair configured with a pair of transistors which are first and second transistors, and amplifies a difference of signals input to each of the gate electrodes of the first and second transistors, to output; a second amplifying unit that amplifies the signal output from the first amplifying unit; a third transistor that connects the first transistor to a power source voltage; a fourth transistor that connects the second transistor to the power source voltage; a fifth transistor that connects a connection point of gate electrodes of the third transistor and the fourth transistor to a drain of the third transistor; and a sixth transistor that connects a connection point of gate electrodes of the third transistor and the fourth transistor to a drain of the fourth transistor, and the method includes performing an auto-zero operation that sets an initial voltage in the circuits of the first amplifying unit and the second amplifying unit in parallel.

In the embodiments of the present disclosure, a comparator includes a first amplifying unit that has a differential pair configured with a pair of transistors which are first and second transistors and amplifies a difference of signals input to each of the gate electrodes of the first and second transistors, to output; and a second amplifying unit that amplifies the signal output from the first amplifying unit. A connection point of gate electrodes of a third transistor that connects the first transistor to a power source voltage and a fourth transistor that connects the second transistor to the power source voltage, and a drain of the third transistor are connected by a fifth transistor, and the connection point and a drain of a fourth transistor are connected by a sixth transistor.

According to the embodiments the present disclosure, it is possible to increase the speed of the AD conversion processing.

BRIEF DESCRIPTION OF THE DRAWINGS

FIG. 11 is a diagram illustrating a timing chart in a second driving method of the comparator;

FIG. 12A and FIG. 12B are diagrams explaining a difference between the first driving method and the second driving method of the comparator;

DETAILED DESCRIPTION OF EMBODIMENTS

Hereinafter, a specific embodiment to which the present disclosure is adapted will be described in detail with reference to drawings.

Figure 1:
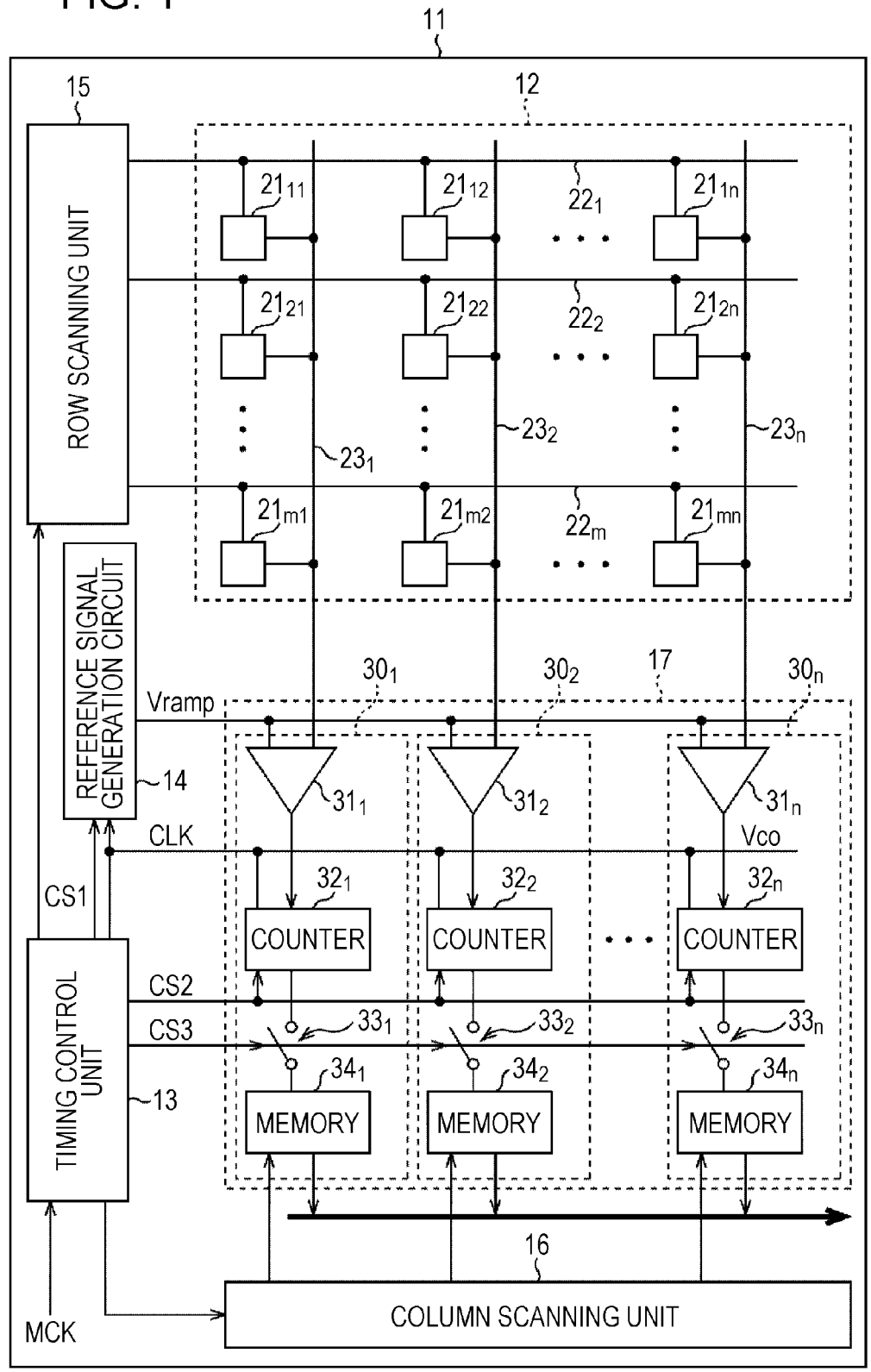
FIG. 1 is a block diagram illustrating a configuration example of a solid-state imaging device to which the present technology is adapted according to an embodiment.

FIG. 1 is a block diagram illustrating a configuration example of a solid-state imaging device to which the present technology is adapted according to an embodiment.

As illustrated in FIG. 1, the solid-state imaging device 11 is a CMOS image sensor, and is configured to include a pixel array unit 12, a timing control unit 13, a reference signal generation circuit 14, a row scanning unit 15, a column scanning unit 16, and a column processing unit 17.

In the pixel array unit 12, a plurality of pixels 21 is arrayed. In the example in FIG. 1, the pixels $21_{11}$ to $21_{mn}$ in row m×column n are arrayed in a matrix shape, and the pixels 21 in each row are connected to the row scanning unit 15 via m horizontal signal lines $22_1$ to $22_m$, and are connected to the column processing unit 17 via n vertical signal lines $23_1$ to $23_n$. In the pixel array unit 12, the pixels $21_{11}$ to $21_{mn}$ operate according to a control signal supplied from the row scanning unit 15 via the horizontal signal lines $22_1$ to $22_m$, and output a pixel signal having a level corresponding to an amount of received light via the vertical signal lines $23_1$ to $23_n$.

The timing control unit 13 generates a signal based on a master clock signal MCK, and controls the operation timing of the reference signal generation circuit 14, the row scanning unit 15, the column scanning unit 16, and the column processing unit 17. For example, the timing control unit 13 generates a clock signal CLK which is a reference for the operations of the reference signal generation circuit 14 and column processing unit 17, and supplies the clock signal CLK to the reference signal generation circuit 14 and column processing unit 17. The timing control unit 13 generates a control signal CS1 that controls the operation of the reference signal generation circuit 14 and supplies the control signal CS1 to the reference signal generation circuit 14, and generates control signals CS2 and CS3 that control the operation of the column processing unit 17 and supplies the control signals CS2 and CS3 to the column processing unit 17.

The reference signal generation circuit 14 generates a reference signal Vramp (so-called ramp signal) of which the voltage drops at a certain gradient according to the clock signal CLK and the voltage value starts to drop at the timing depending on the control signal CS1, and supplies the reference signal Vramp to the column processing unit 17 via a reference signal wiring.

The row scanning unit 15 supplies a control signal (for example, a transfer signal, a selection signal, a reset signal, or the like) that controls the driving of the pixels $21_{11}$ to $21_{mn}$ of the pixel array unit 12 for each row, to the pixels $21_{11}$ to $21_{mn}$ at the timing depending on the control from the timing control unit 13.

The column scanning unit 16 supplies a control signal that outputs the pixel signal which is AD converted by the column processing unit 17 to the horizontal output line in an order of each row from the pixels $21_{11}$ to $21_{mn}$, to the column processing unit 17 at the timing depending on the control from the timing control unit 13.

The column processing unit 17 includes n AD conversion circuits $30_1$ to $30_n$ corresponding to the number of columns of the pixels $21_{11}$ to $21_{mn}$ that are arrayed in the pixel array unit 12. The pixels $21_{11}$ to $21_{mn}$ are connected to the column processing unit 17 via the vertical signal line $23_1$ to $23_n$. Then, in the column processing unit 17, the AD conversion circuits $30_1$ to $30_n$ AD convert and output the pixel signal output from the pixels $21_{11}$ to $21_{mn}$ for each row of the pixels $21_{11}$ to $21_{mn}$ in parallel.

The AD conversion circuits $30_1$ to $30_n$ are configured to include comparators $31_1$ to $31_n$, counters $32_1$ to $32_n$, switches $33_1$ to $33_n$, and memories $34_1$ to $34_n$, respectively. The AD conversion circuits $30_1$ to $30_n$ are configured to be the same. Thus, hereinafter, in a case where they are not distinguished from each other, the AD conversion circuits $30_1$ to $30_n$ will be referred to as AD conversion circuit 30. The above description will also be applied to each part of the AD conversion circuit 30.

In the comparator 31, one input terminal is connected to the pixel 21 via the vertical signal line 23, the other input terminal is connected to the reference signal generation circuit 14 via the reference signal wiring, and the output terminal is connected to the counter 32. Then, the comparator 31 compares the voltage of the pixel signal input via the vertical signal line 23 and the voltage of the reference signal Vramp supplied from the reference signal generation circuit 14, for example, in a case where the voltage of the reference signal Vramp_is higher than the voltage of the pixel signal, then outputs the high level signal, and in a case where the reference signal Vramp_is equal to or lower than the voltage of the pixel signal, then outputs the low level signal.

The counter 32 performs the counting in synchronization with the clock signal CLK supplied from the timing control unit 13 according to the control signal CS2 supplied from the timing control unit 13. For example, the counter 32 measures a comparing duration from the starting of the comparing operation in the comparator 31 to the end of the comparing operation (for example, D-phase inversion time and P-phase inversion time described below in FIG. 6) by performing the down counting or up counting in synchronization with the clock signal CLK.

The switch 33 is in an ON state (closed) at the time point when the counting operation of the counter 32 regarding the pixel 21 in the predetermined row is completed, according to the control signal CS3 supplied from the timing control unit 13. Then, the switch 33 transfers the counted result of the counter 32, that is, the pixel signal which is converted to a digital signal from an analog signal, to the memory 34.

The memory 34 outputs the kept pixel signal to the horizontal output line according to the control signal supplied from the column scanning unit 16.

Next, the configuration of the pixel 21 will be described with reference to FIG. 2.

Figure 2:
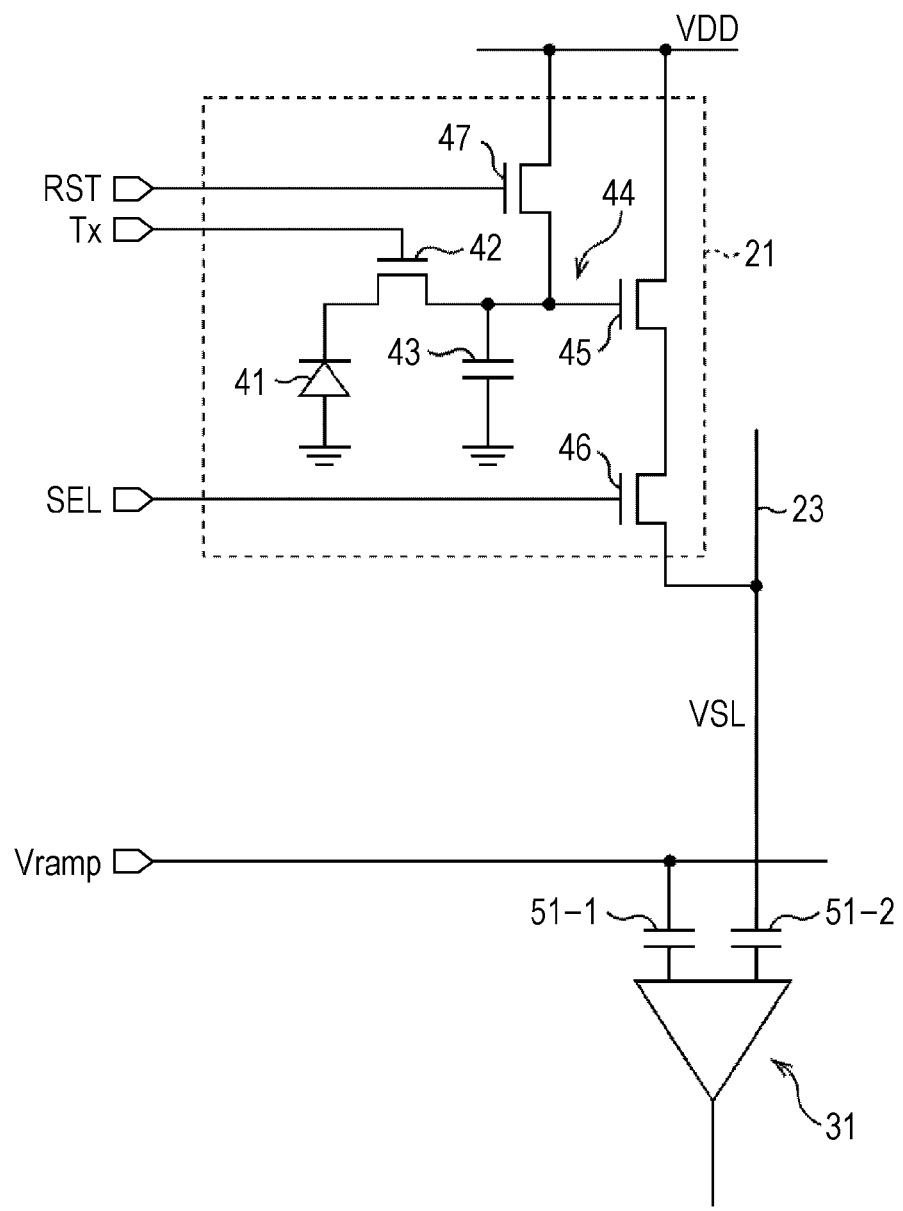
FIG. 2 is a diagram explaining a configuration of a pixel.

As illustrated in FIG. 2, the pixel 21 is configured to include a photo diode 41, a transfer transistor 42, an electric charge accumulation unit 43, an FD unit 44, an amplifier transistor 45, a selection transistor 46, and a reset transistor 47.

The photo diode 41 is a photoelectric conversion unit that converts a light to an electric charge, and generates and accumulates the charges according to the amount of the received light. An anode electrode of the photo diode 41 is grounded, and the cathode electrode of the photo diode 41 is connected to a gate electrode of the amplifier transistor 45 via the transfer transistor 42.

The transfer transistor 42 drives according to a transfer signal Tx supplied from the row scanning unit 15 in FIG. 1. When the transfer signal Tx supplied to the gate electrode of the transfer transistor 42 is at a high level, the transfer transistor 42 is in the ON state, and the charges accumulated in the photo diode 41 are transferred to the FD unit 44 via the transfer transistor 42.

The electric charge accumulation unit 43 is a capacitance provided between the FD unit 44 and the ground level, and accumulates the charges transferred from the photo diode 41 to the FD unit 44 via the transfer transistor 42.

The FD unit 44 is an electric charge detection unit that converts the charges to the voltage; the charges kept in the FD unit 44 are converted into the voltage in the amplifier transistor 45.

The amplifier transistor 45 is an input unit of a source follower that is a read-out circuit which reads out the signal obtained by the photoelectric conversion in the photo diode 41, and outputs the pixel signal having the level corresponding to the charges accumulated in the FD unit 44 to the vertical signal line 23. That is, the amplifier transistor 45 configures a current source which is connected to one end of the vertical signal line 23 and the source follower by the source electrode of the amplifier transistor 45 being connected to the vertical signal line 23 via the selection transistor 46.

The selection transistor 46 drives according to a selection signal SEL supplied from the row scanning unit 15 in FIG. 1. For example, when the selection signal SEL supplied to the gate electrode of the selection transistor 46 is at the high level, the selection transistor 46 is in the ON state and connects the amplifier transistor 45 and the vertical signal line 23, and then, makes the output signal VSL output from the amplifier transistor 45 be in a state that can be output to the vertical signal line 23.

The reset transistor 47 operates according to a reset signal RST supplied from the row scanning unit 15 in FIG. 1. For example, when the reset signal RST supplied to the gate electrode of the reset transistor 47 is at the high level, the reset transistor 47 is in the ON state and discharges the charges accumulated in the FD unit 44 to the power source voltage VDD, and then resets the FD unit 44.

The vertical signal line 23 is connected to one input terminal of the comparator 31 via a condenser 51-2, and the other input terminal of the comparator 31 is connected to the reference signal generation circuit 14 that supplies the reference signal Vramp via the condenser 51-1.

In the solid-state imaging device 11 configured in this way, by the charges accumulated in the photo diode 41 being batch transferred to the FD unit 44, and being read out sequentially for each column, the simultaneity of a shutter closing is retained.

In the solid-state imaging device 11, the D-phase first-read drive is performed, in which the signal level (D-phase) in a state in which the charges generated in the photo diode 41 are kept in the FD unit 44 is read out first, and then the reset level (P-phase) in a state in which the charges in the FD unit 44 are discharged via the reset transistor 47 is read out.

Figure 3:
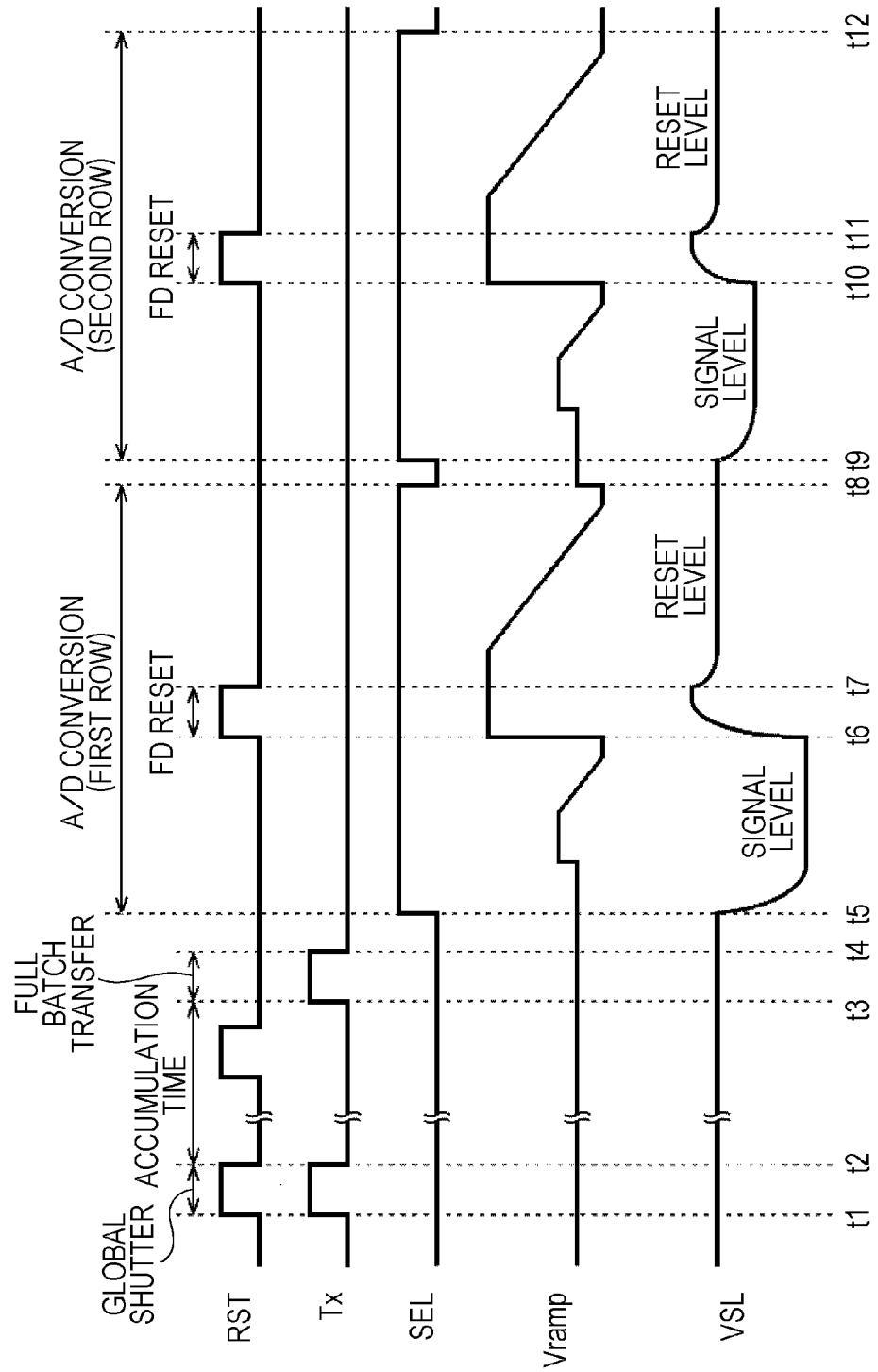
FIG. 3 is a diagram explaining a D-phase first-read drive.

The D-phase first-read drive will be described with reference to FIG. 3. In FIG. 3, from top to bottom in an order, the reset signal RST, the transfer signal Tx, the selection signal SEL, the reference signal Vramp, and the output signal VSL are illustrated.

First, at the point in time t1, by the reset signal RST and the transfer signal Tx being at the high level, the shutter operation is performed, in which the charges of the photo diode 41 are discharged. At this time, by performing the shutter operation in all of the pixels 21 arrayed in the pixel array unit 12 simultaneously, a global shutter is realized, in which accumulation duration is to be in the same timing for all of the pixels 21.

Next, at the point in time t2, when the reset signal RST and the transfer signal Tx are at a low level, the shutter operation is completed, and the accumulation duration starts, in which the charges generated by the photoelectric conversion in the photo diode 41 are accumulated.

Then, at the point in time t3, by the transfer signal Tx being at the high level, the accumulation duration ends, and the transfer operation is performed, in which the charges accumulated in the photo diode 41 are transferred to the FD unit 44. Before the accumulation duration ends, by the reset signal RST being at the high level in a pulse shape, the charges accumulated in the FD unit 44 during the accumulation duration are discharged. In order to realize the global shutter, the full-batch transfer is performed, during which the transfer operation is performed simultaneously in all of the pixels 21 arrayed in the pixel array unit 12. At the point in time t4, when the transfer signal Tx is in the low level, the transfer operation is completed.

Then, the AD conversion is performed in an order from the pixels 21 of the first row. First, at the point in time t5, by the selection signal SEL of the pixels 21 of the first row being at the high level, the pixels 21 of the first row are selected, and then the amplifier transistors 45 are connected to the vertical signal lines 23. After the point in time t5, in a state in which the level of the output signal VSL output via the vertical signal line 23 is stable, the signal level (D-phase) corresponding to the charges generated in the photo diode 41 is read out.

Next, from the point in time t6 to t7, the rest signal RST is at the high level, the charges accumulated in the FD unit 44 are discharged via the reset transistor 47, and then the FD unit 44 is reset. Then, after the point in time t7, in a state in which the level of the output signal VSL_is stable, the reset level (P-phase) in the state in which the charges of the FD unit 44 are discharged is read out. Then, in the point in time t8, by the selection signal SEL of the pixels 21 of the first row being in the low level, the selection of the pixels 21 of the first row is released, and then the AD conversion processing of the pixels 21 of the first row is completed.

Then, in the point in time t9 to t12, similar to the case in the point in time t5 to t8, the AD conversion processing of the pixels 21 of the second row is performed, and thereafter, the AD conversion processing of the pixels 21 of each row up to an $m_{th}$ row is sequentially and repeatedly performed.

Figure 4:
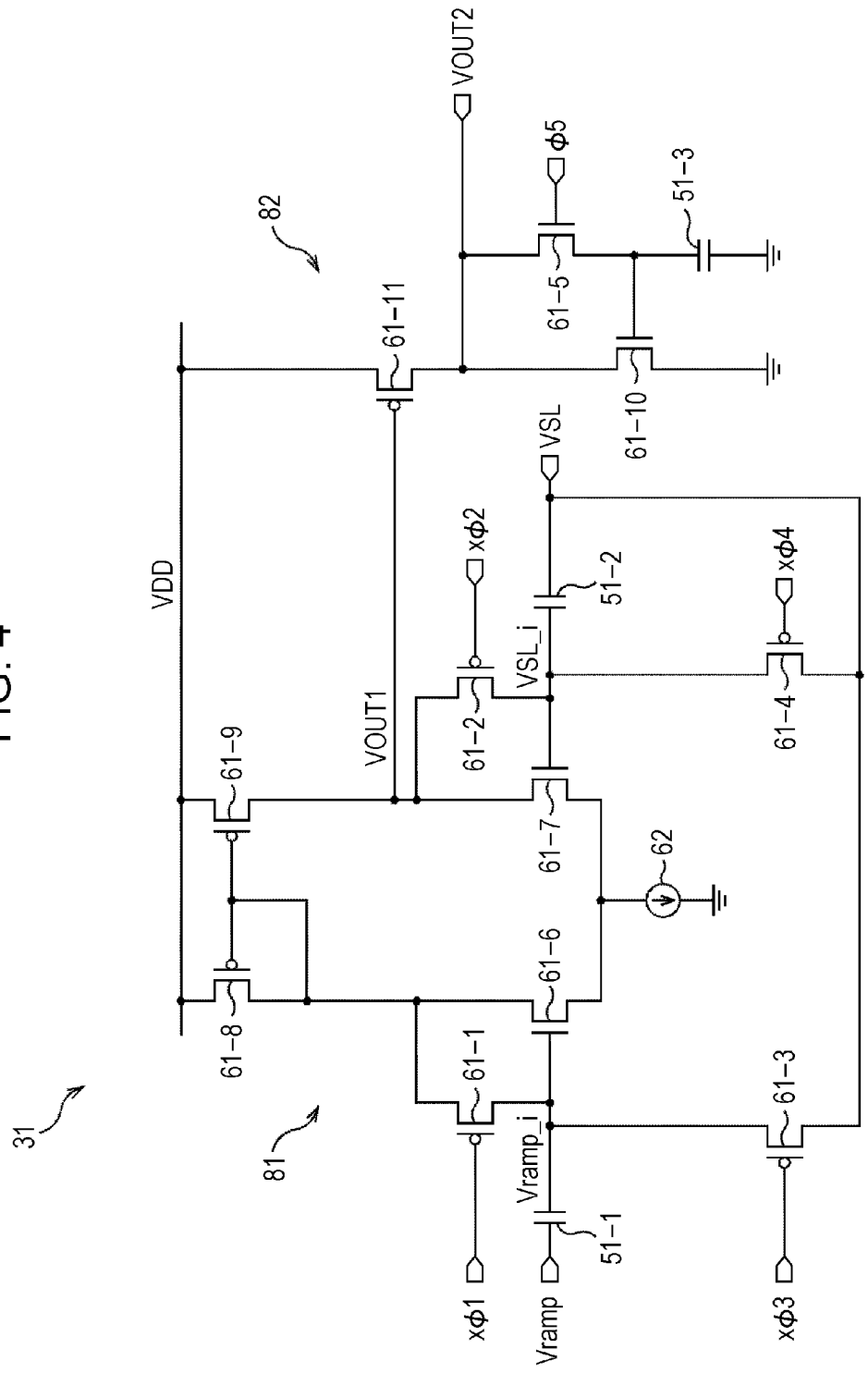
FIG. 4 is a circuit diagram illustrating a configuration example of a comparator to which the present technology is adapted according to a first embodiment.

Next, FIG. 4 is a circuit diagram illustrating a configuration example of a comparator 31 to which the present technology is adapted according to the first embodiment.

As illustrated in FIG. 4, the comparator 31 is configured in combination of condensers 51-1 to 51-3, transistors 61-1 to 61-11, and a current source 62.

In the comparator 31, the source electrodes of the transistors 61-6 and 61-7 are connected in common and configure a differential pair, and the current source 62 is connected between the common source electrodes.

The gate electrode of the transistor 61-6 is connected to the reference signal generation circuit 14 (FIG. 1) that supplies the reference signal Vramp via the condenser 51-1, and an internal node Vramp_i in the gate electrode of the transistor 61-6 is the voltage corresponding to the reference signal Vramp. The gate electrode of the transistor 61-7 is connected to the vertical signal line 23 (FIG. 1) that supplies the output signal VSL via the condenser 51-2, and an internal node VSL_i in the gate electrode of the transistor 61-7 is the voltage corresponding to the output signal VSL.

The transistor 61-8 is connected between the drain electrode of the transistor 61-6 and the power source voltage VDD in a diode connection configuration, that is, in a configuration in which the gate electrode and the drain electrode become common. The transistor 61-9 is connected between the drain electrode of the transistor 61-7 and the power source voltage VDD. The gate electrode of the transistor 61-8 and the gate electrode of the transistor 61-9 are commonly connected to each other.

The transistor 61-1 is connected between the gate electrode and the drain electrode of the transistor 61-6, and a control signal xφ1 from the row scanning unit 15 (FIG. 1) is supplied to the gate electrode of the transistor 61-1. The transistor 61-2 is connected between the gate electrode and drain electrode of the transistor 61-7, and a control signal xφ2 from the row scanning unit 15 is supplied to the gate electrode of the transistor 61-2.

The transistor 61-3 is connected between gate electrode of the transistor 61-6 and the vertical signal line 23, and a control signal xφ3 from the row scanning unit 15 is supplied to the gate electrode of the transistor 61-3. The transistor 61-4 is connected between gate electrode of the transistor 61-7 and the vertical signal line 23, and a control signal xφ4 from the row scanning unit 15 is supplied to the gate electrode of the transistor 61-4. That is, the source electrode of the transistors 61-3 and 61-4 are commonly connected to the vertical signal line 23.

The transistor 61-11 is connected between the output terminal of the comparator 31 and the power source voltage VDD, and the gate electrode of the transistor 61-11 is connected to the connection point of the transistors 61-7 and 61-9.

The transistor 61-10 is connected between the source electrode of the transistor 61-11 and the ground, and the gate electrode of the transistor 61-10 is connected to the connection point of the transistors 61-5 and 51-3.

The drain electrode of the transistor 61-5 is connected to the output terminal of the comparator 31, and the source electrode of the transistor 61-5 is grounded via the condenser 51-3, and a control signal φ5 from the row scanning unit 15 is supplied to the gate electrode of the transistor 61-5.

The comparator 31 is configured in this way. Accordingly, by a differential amplifier in which the transistors 61-6 and 61-7 are configured to be a pair, a difference between the reference signal Vramp_input to the gate electrode of the transistor 61-6 and the output signal VSL_input to the gate electrode of the transistor 61-7 is amplified and output. The output from the differential amplifier is amplified by a source-grounded amplifier configured with the transistors 61-10 and 61-11, and is output from the output terminal of the comparator 31.

Hereinafter, the source-ground amplifier configured with the transistors 61-6 to 61-9 and the current source 62 is called a first-stage amplifier 81, and the output of the first-stage amplifier 81 is set to amplifier output VOUT1. The differential amplifier configured with the transistors 61-10 to 61-11 is called a post-stage amplifier 82, and the output of the post-stage amplifier 82 is set to amplifier output Vout2. The transistors 61-1 to 61-5 are used for operation of setting the initial voltage in the comparator 31 circuit (hereafter referred to as auto-zero operation). The condensers 51-1 to 51-3 are capacitance devices for keeping the internal voltage (operating point) of the amplifier.

Figure 5:
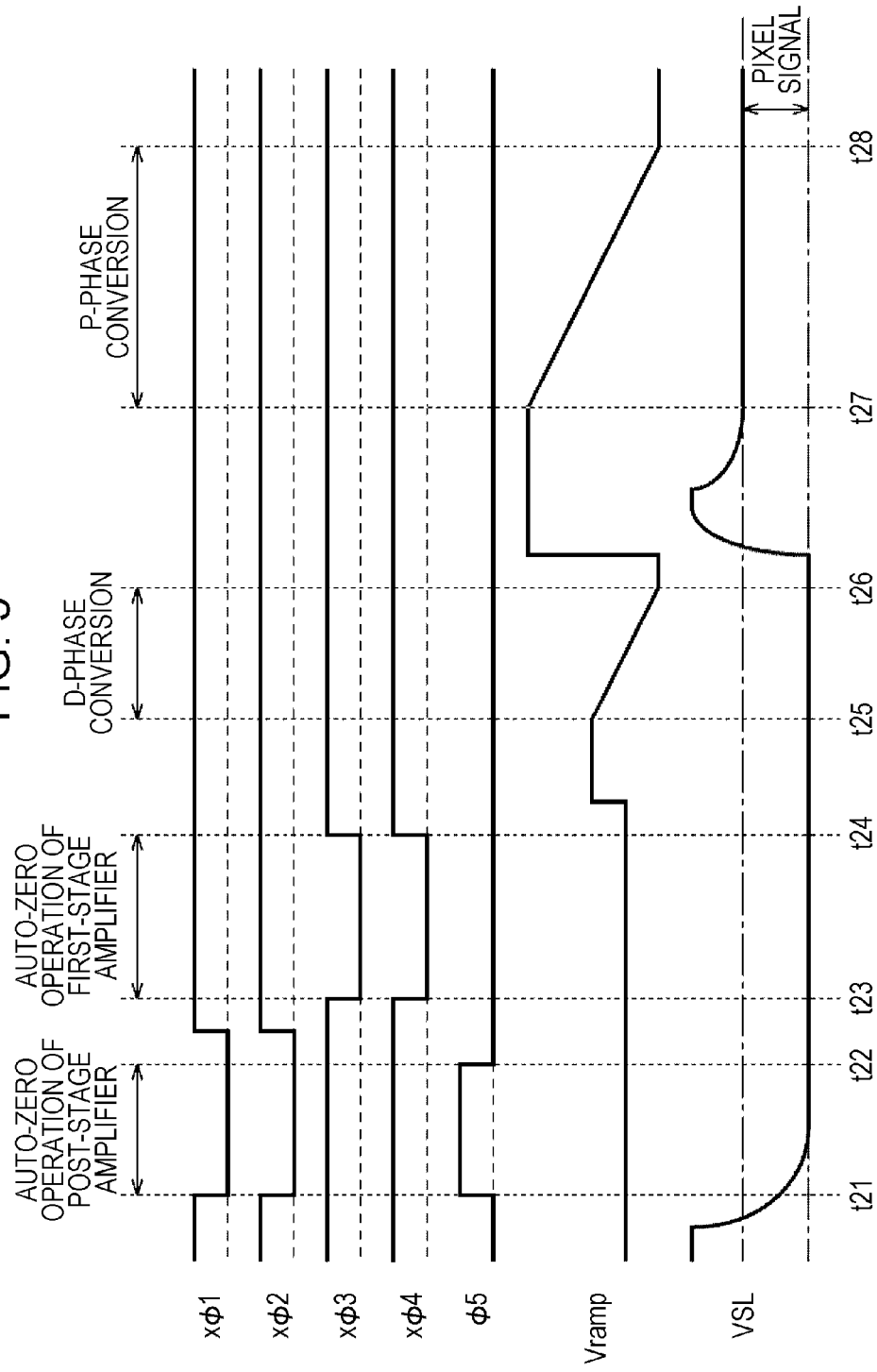
FIG. 5 is a diagram illustrating a timing chart in a first driving method of the comparator.

In FIG. 5, a timing chart in a first driving method of the comparator 31 is illustrated.

In FIG. 5, from top to bottom in an order, the control signal xφ1 for controlling the transistor 61-1, the control signal xφ2 for controlling the transistor 61-2, the control signal xφ3 for controlling the transistor 61-3, the control signal xφ4 for controlling the transistor 61-4, the control signal φ5 for controlling the transistor 61-5, the reference signal Vramp for the reference in comparing the voltage level, and the output signal VSL output from the pixel 21 to the vertical signal line 23 are illustrated.

First, at the point in time t21, the control signals xφ1 and xφ2 are shifted to the low level from the high level, and the control signal φ5 is shifted to the high level from the low level. At this time, the control signals xφ3 and xφ4 remain at the high level. Accordingly, since an inverted control signal is input to the transistors 61-1 and 61-2, the transistors 61-1 and 61-2 are in the ON state according to the control signals xφ1 and xφ2, respectively, and the transistor 61-5 is in the ON state according to the control signal φ5. In this way, the auto-zero operation of the post-stage amplifier 82 starts.

That is, in the auto-zero operation of the post-stage amplifier 82, the initial voltage set by the transistors 61-1 and 61-2 being in the ON state is kept as the internal node Vramp_i in the gate electrode of the transistor 61-6 and is kept as the internal node VSL_i in the gate electrode of the transistor 61-7. At the same time, in the post-stage amplifier 82, by the transistor 61-5 being in the ON state, the current corresponding to the amplifier output VOUT1 of the first-stage amplifier 81 flows in the transistor 61-10 and 61-11. Then, at the time point (t22) when the transistor 61-5 is in an OFF state, the voltage value corresponding to the amount of current in the transistor 61-10 is kept in the condenser 51-3.

At the point in time t22, by the control signal φ5 being shifted to low level and the transistor 61-5 being in the OFF state, the auto-zero operation of the post-stage amplifier 82 is completed. Subsequently, the control signals xφ1 and xφ2 are shifted to the high level and the transistors 61-1 and 61-2 are in the OFF state.

Next, at the point in time t23, the control signals xφ3 and xφ4 are shifted to the low level from the high level. Accordingly, since an inverted control signal is input to the transistors 61-3 and 61-4, the transistors 61-3 and 61-4 are in the ON state according to the control signals xφ3 and xφ4, respectively. In this way, the auto-zero operation of the first-stage amplifier 81 starts.

That is, in the auto-zero operation of the first-stage amplifier 81, the signal level of the output signal VSL supplied via the vertical signal line 23 is directly input to the gate electrode of the transistors 61-6 and 61-7. In this way, the signal level of the output signal VSL_is set as initial voltages of the internal node Vramp_i in the gate electrode of the transistor 61-6 and the internal node VSL_i in the gate electrode of the transistor 61-7.

At the point in time t24, the control signals xφ3 and xφ4 being shifted to the high level and the transistors 61-3 and 61-4 being in the OFF state, the auto-zero operation of the first-stage amplifier 81 is completed.

Subsequently, the reference signal Vramp drops at a constant gradient during the period of the time from t25 to t26, and AD conversion for D-phase is performed. Then, as described with reference to FIG. 3, after the FD unit 44 being reset, the reference signal Vramp drops at a constant gradient during the period of the time from t27 to t28, and AD conversion for P-phase is performed.

In this way, in the auto-zero operation of the first-stage amplifier 81 in the comparator 31, it is possible to automatically set (adjust) the signal level of the output signal VSL as the initial voltage of the internal node Vramp_i in the gate electrode of the transistor 61-6 and the internal node VSL_i in the gate electrode of the transistor 61-7.

Figure 6:
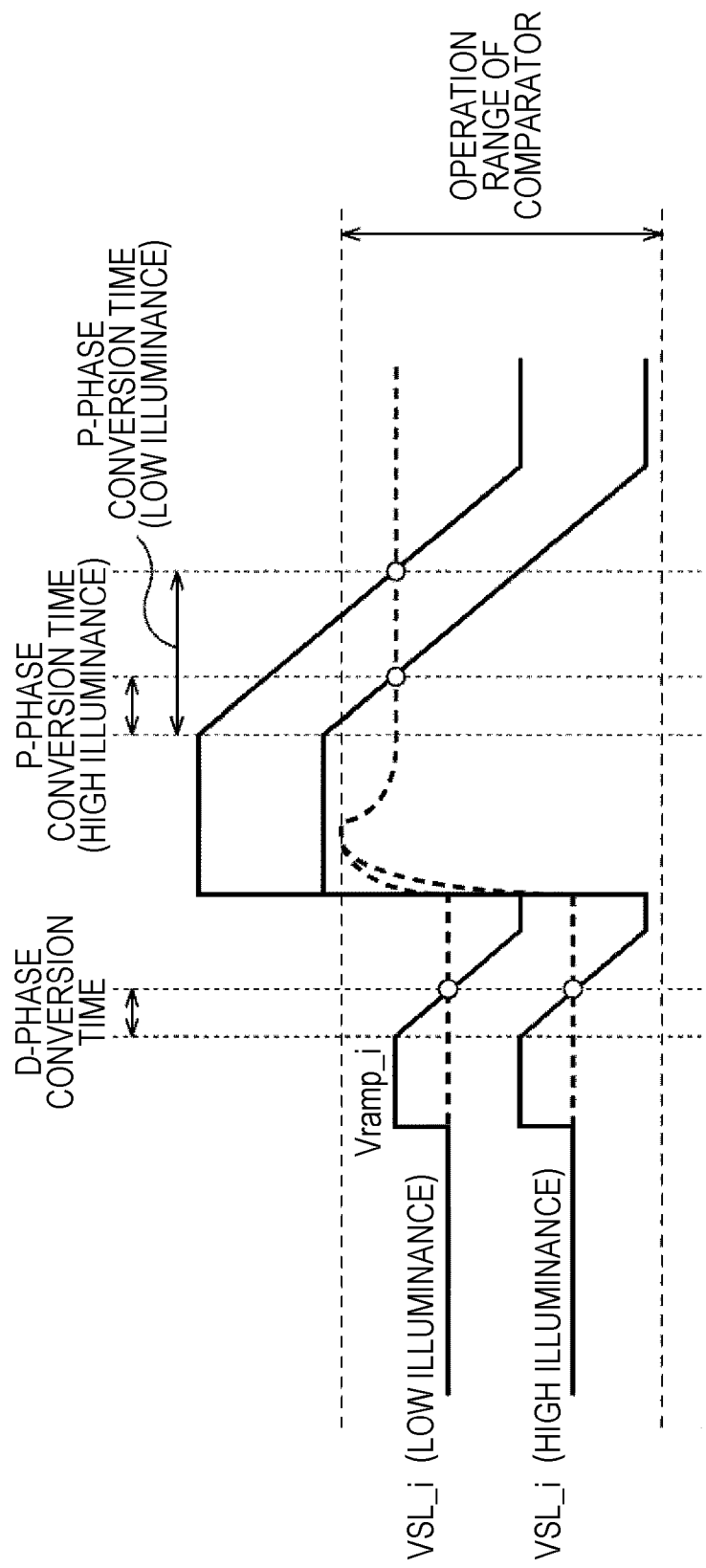
FIG. 6 is a diagram explaining a voltage waveform in the comparator.

Next, in FIG. 6, a voltage waveform in the comparator 31 is illustrated.

As described with reference to FIG. 5, by the auto-zero operation of the first-stage amplifier 81, the initial voltages of the internal node Vramp_i and the internal node VSL_i are set as the signal level of the output signal VSL supplied via the vertical signal line 23.

At this time, since the output signal VSL corresponds to the level of the charges kept in the FD unit 44, that is, the level of charges generated in the photo diode 41, the electric potential level of the output signal VSL depends upon the illuminance of the light irradiated to the photo diode 41. Therefore, as illustrated in FIG. 6, in the auto-zero operation of the first-stage amplifier 81, the electric potential level is low in a case where the illuminance of the light irradiated to the photo diode 41 is high, and the electric potential level is high in a case where the illuminance of the light irradiated to the photo diode 41 is low.

In this way, after the initial voltages of the internal node Vramp_i and the internal node VSL_i are set as the signal level of the output signal VSL supplied via the vertical signal line 23, the internal node Vramp_i drops according to the reference signal Vramp which drops at a constant gradient. Then, at the voltage where the internal node Vramp_i in the gate electrode of the transistor 61-6 and the internal node VSL_i in the gate electrode of the transistor 61-7 are matched, the amplifier outputs VOUT1 and VOUT2 are inverted, and the D-phase conversion is performed.

Subsequently, in accordance with resetting of the FD unit 44 of the pixel 21, the reference signal Vramp_is reset to a high voltage level, and the reference signal Vramp_is dropped again. Then, at the voltage where the internal node Vramp_i in the gate electrode of the transistor 61-6 and the internal node VSL_i in the gate electrode of the transistor 61-7 are matched again, the amplifier outputs VOUT1 and VOUT2 are inverted, and the P-phase conversion is performed.

In this way, since the initial voltages of the internal node Vramp_i and the internal node VSL_i are set as the signal level of the output signal VSL supplied via the vertical signal line 23, the operation point (a point illustrated by o in Figure) of the comparator 31 in the D-phase conversion changes according to the voltage level of the vertical signal line 23. In contrast, since the reset level of the vertical signal line 23 for each pixel 21 is substantially the same having some variations, the operating point (the point illustrated by o in Figure) of the comparator 31 in the P-phase conversion is substantially the same.

For this reason, by designing the comparator 31 in such a manner that the reset level (the voltage level of P-phase) fits within the operable input range, the initial voltage is automatically determined according to the voltage level of D-phase. Therefore, the comparator 31 can perform the AD conversion without performing the adjustment of initial voltage.

In the comparator 31, by setting the initial voltages of the internal node Vramp_i and the internal node VSL_i to the signal level of the output signal VSL supplied via the vertical signal line 23, the external power source for setting those initial voltages is not necessary, and thus, it is possible to achieve a reduction in power consumption and in size.

The comparator in the related art will be described with reference to FIG. 7 to FIG. 9.

For example, in the D-phase first-read drive as described with reference to FIG. 3, in a case where the AD conversion is performed in the post-stage comparator circuit having the auto-zero function, in the related art, the auto-zero operation is performed with reference to the D-phase which is read out first, and thus the operating point is set inside the circuit.

Figure 7:
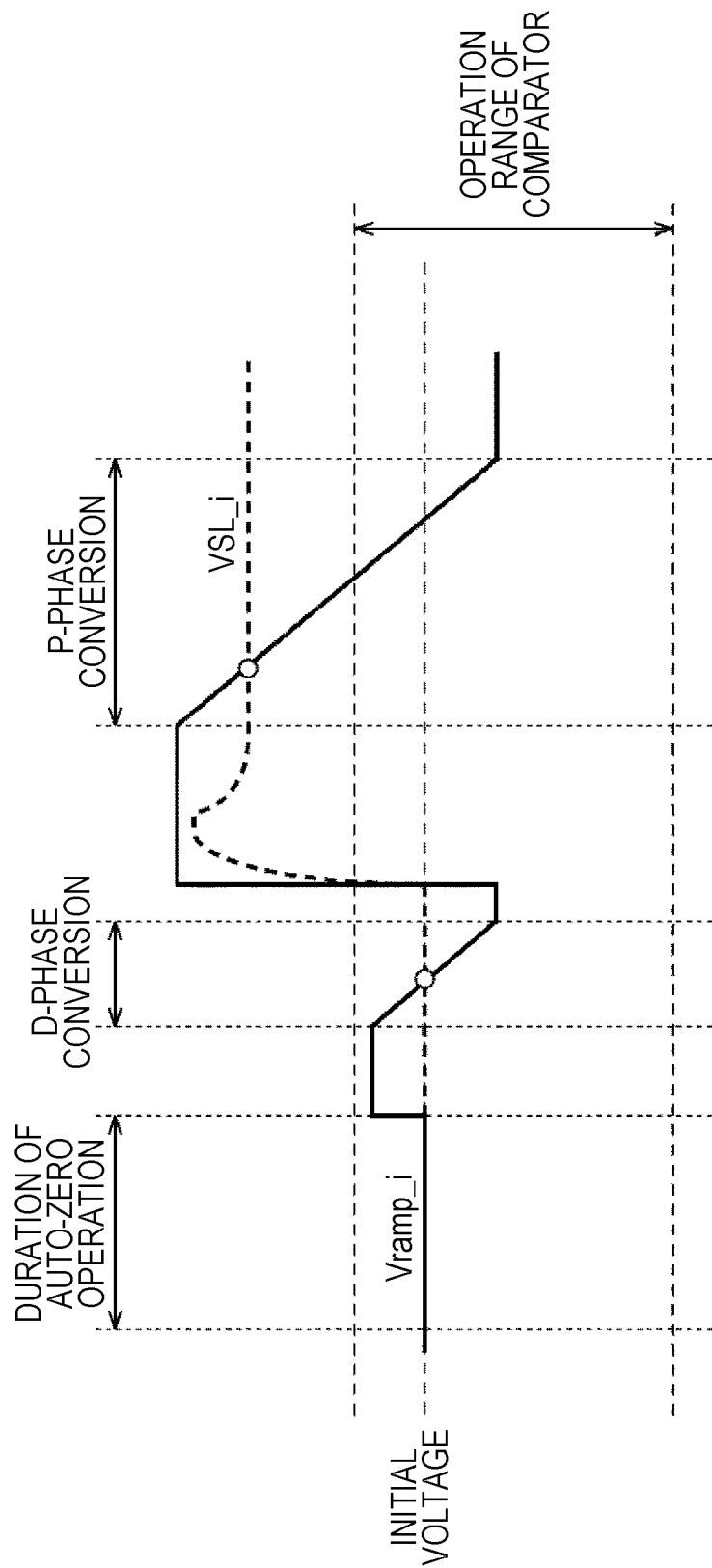
FIG. 7 is a diagram explaining a voltage waveform in the comparator in the related art.

In FIG. 7, a voltage waveform inside the comparator circuit in such case is illustrated.

As illustrated in FIG. 7, the voltage level of the vertical signal line that connects the pixel and the comparator circuit is low at the time of D-phase conversion, and is high at the time of P-phase conversion due to the FD unit 44 of the pixel 21 being reset. For this reason, if the auto-zero operation is performed with reference to the D-phase, the internal voltage of the comparator circuit (that is, the internal node Vramp_i and the internal node VSL_i) exceeds the operable voltage range of the first-stage amplifier 81. As a result, it is difficult to perform the AD conversion processing as normal.

As disclosed in Japanese Patent Application Publication Number No. 2011-229120 described above, it has been necessary for an initial voltage to be externally applied from the outside for setting (adjusting) the internal node such that the comparator is operable in accordance with the signal level of the D-phase signal.

Figure 8:
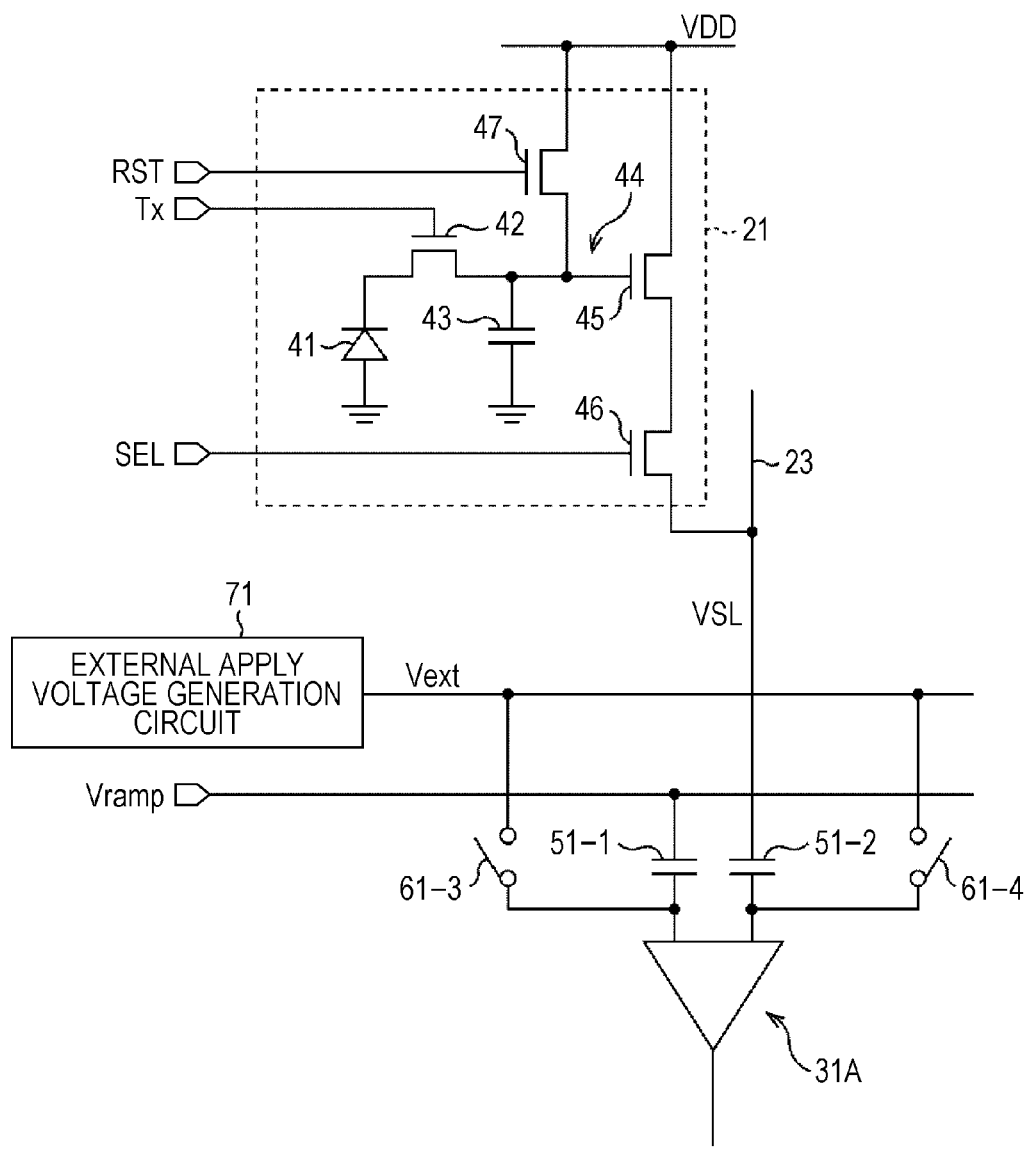
FIG. 8 is a diagram explaining an external apply voltage generation circuit necessary for the comparator in the related art.

That is, as illustrated in FIG. 8, in order to operate the comparator 31A as normal in the related art, an external apply voltage generation circuit 71 has been necessary to generate an arbitrary external apply voltage Vext and supply the arbitrary external apply voltage Vext to the comparator 31A via the reference signal wiring.

Figure 9:
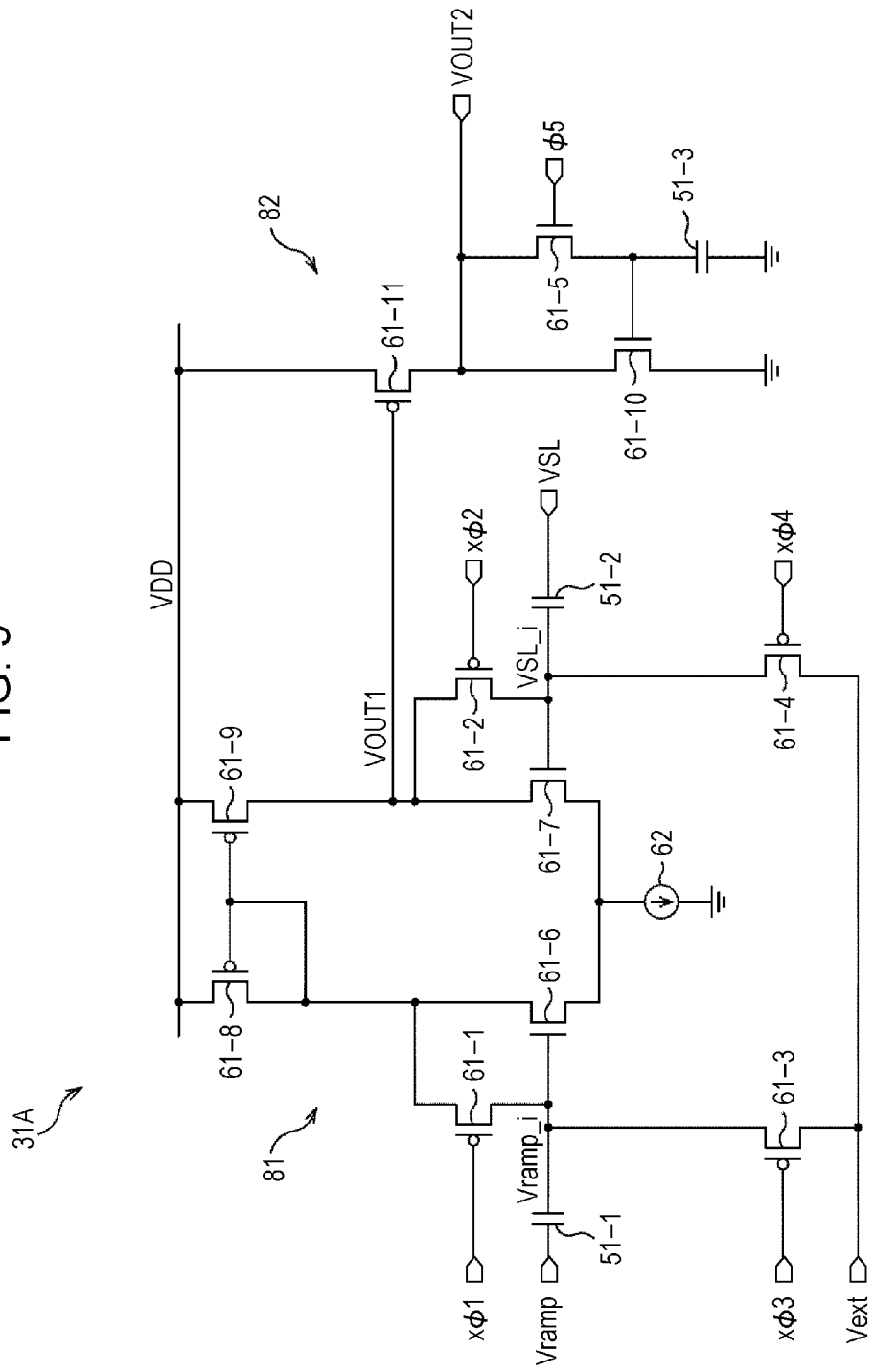
FIG. 9 is a circuit diagram illustrating a configuration example of the comparator in the related art.

FIG. 9 is a circuit diagram illustrating a configuration of the comparator 31A in the related art. In the comparator 31A in FIG. 9, the configurations in common with the comparator 31 in FIG. 4 will be referenced by the same numerals, and the descriptions will not be repeated.

As illustrated in FIG. 9, the comparator 31A in the related art has a configuration different from the comparator 31 in FIG. 4 in the point that the external apply voltage Vext is applied to the source electrodes of the transistors 61-3 and 61-4. That is, the source electrodes of the transistors 61-3 and 61-4 are connected to the external apply voltage generation circuit 71 (FIG. 8) in the comparator 31A in the related art while the source electrodes of the transistors 61-3 and 61-4 are commonly connected to the vertical signal line 23 in the comparator 31 in FIG. 4.

In the comparator 31A in the related art, in the auto-zero operation of the first-stage amplifier 81, the arbitrary external apply voltage Vext generated in the external apply voltage generation circuit 71 is directly input to the gate electrodes of the transistors 61-6 and 61-7 that configure the first-stage amplifier 81. In this way, the initial voltages of the internal node Vramp_i and the internal node VSL_i are set.

Figure 10:
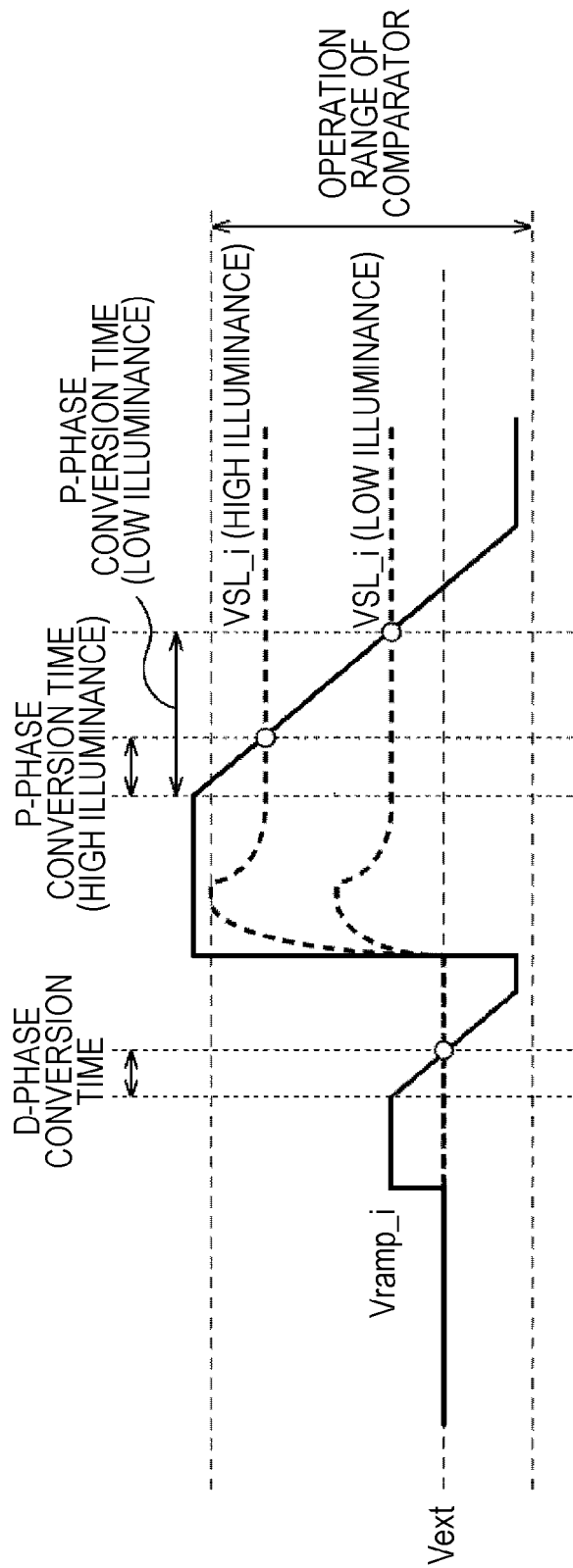
FIG. 10 is a diagram explaining a voltage waveform in the comparator in the related art that uses the external apply voltage generation circuit.

In FIG. 10, the voltage waveform in the comparator 31A that uses the external apply voltage generation circuit 71 is illustrated. The operation timing chart of the comparator 31A is similar to the timing chart of the comparator 31 described with reference to FIG. 5.

First, by the auto-zero operation of the first-stage amplifier 81, after the internal node Vramp_i and the internal node VSL_i being set to apply voltage Vext, the internal node Vramp_i in the gate electrode of the transistor 61-6 drops according to the changing reference signal Vramp as illustrated in FIG. 5. Then, at the voltage where the internal node Vramp_i and the internal node VSL_i are matched, the amplifier outputs VOUT1 and VOUT2 are inverted, and the D-phase conversion is performed.

Subsequently, in accordance with resetting of the FD unit 44 of the pixel 21, the reference signal Vramp_is reset to the high voltage level, and the reference signal Vramp_is dropped again. Then, at the voltage where the internal node Vramp_i and the internal node VSL_i are matched again, the amplifier outputs VOUT1 and VOUT2 are inverted, and the P-phase conversion is performed.

As illustrated in FIG. 10, in the comparator 31A in the related art, the initial voltages of the internal node Vramp_i and the internal node VSL_i are set by the external apply voltage Vext in such a manner that the operating point in the D-phase conversion and the operating point in the P-phase conversion at a high illuminance and low illuminance are within the operating range of the comparator. That is, in the comparator 31A in the related art, by appropriately setting the external apply voltage Vext, the internal voltage of the comparator circuit exceeding the operable voltage range of the first-stage amplifier 81 described with reference to FIG. 7 has been avoided.

However, in the imaging device, generally, the voltage applied from the outside is the power source voltage and the control signal for driving. For this reason, in order to set the initial voltages of the internal node Vramp_i and the internal node VSL_i by the external apply voltage Vext, the external apply voltage generation circuit 71 (FIG. 8) for generating the external apply voltage Vext is necessary in the imaging device. Furthermore, since it is necessary that the external apply voltage Vext is set (adjust) according to the output signal of the pixel 21 in such a manner that the internal voltage fits within the operable voltage range, a control circuit for performing such a setting is necessary. Therefore, the power consumption in the imaging device increases and the size of the imaging device increases.

In contrast, in the comparator 31 to which the present technology is applied, it is possible to set the initial voltages of the internal node Vramp_i and the internal node VSL_i to the signal level of output signal VSL supplied via the vertical signal line 23 as described above. In this way, since it is not necessary to provide the external apply voltage generation circuit 71, it is possible to achieve a reduction in power consumption and a size.

In the comparator 31 to which the present technology is applied, the initial voltages of the internal node Vramp_i and the internal node VSL_i are automatically determined to be in the operable voltage range of the first-stage amplifier 81. Therefore, since it is not necessary to provide the control circuit for setting the initial voltage, the simple configuration of the comparator 31 can be realized.

Incidentally, in the driving illustrated in FIG. 6, the output signal VSL_is input via vertical signal line 23 to the transistors 61-6 and 61-7 that configure the first-stage amplifier 81, and the internal node Vramp_i and the internal node VSL_i are set to the same initial voltages. For this reason, a mismatch in the differential amplifier is output as it is as the inversion error of the comparator 31. As the column processing unit 17 in FIG. 1, in the configuration in which a number of comparators 31 are disposed in parallel, the value of mismatch in the differential amplifier becomes difficult to ignore as the resolution of the AD conversion decreases. Therefore, it is necessary to solve the problem of mismatch in the differential amplifier.

In FIG. 11, a timing chart in a second driving method of the comparator 31 is illustrated.

First, at the point in time t31, the control signals xφ1 and xφ2 are shifted to the low level from the high level, and the control signal φ5 is shifted to the high level from the low level. At this time, the control signals x3 and xφ4 remain at the high level. Accordingly, since an inverted control signal is input to the transistors 61-1 and 61-2, the transistors 61-1 and 61-2 are in the ON state according to the control signals xφ1 and xφ2, respectively, and the transistor 61-5 is in the ON state according to the control signal φ5. In this way, the auto-zero operation of the post-stage amplifier 82 starts.

At the point in time t32, by the control signal φ5 being shifted to the low level and the transistor 61-5 being in the OFF state, the auto-zero operation of the post-stage amplifier 82 is completed. Subsequently, only the control signals xφ1 are shifted to the high level and the transistor 61-1 is in the OFF state, and the control signal xφ2 remains at the low level.

Subsequently, at the point in time t33, the control signal xφ3 is shifted to the low level from the high level. Accordingly, since an inverted control signal is input to the transistors 61-3, the transistors 61-3 is in the ON state according to the control signal xφ3. At this time, since the control signal xφ2 remains in the state of the low level, the transistor 61-2 remains in the ON state. Accordingly, the auto-zero operation of the first-stage amplifier 81 starts. At the point in time t34, the control signals xφ2 and xφ3 being shifted to the high level and the transistors 61-2 and 61-3 being in the OFF state, and thus, the auto-zero operation of the first-stage amplifier 81 is completed. Subsequently, during the period of the time from t35 to t36, D-phase conversion is performed, and during the period of the time from t37 to t38, P-phase conversion is performed.

In this way, in the auto-zero operation of the comparator 31 in the second driving method, at the time of the auto-zero operation of the first-stage amplifier 81 configured from transistors 61-6 to 61-9, the transistors 61-2 and 61-3 are in the ON state and transistors 61-1 and 61-4 are in the OFF state. Therefore, the first-stage amplifier 81 comes to have a voltage follower configuration in which the amplifier output VOUT1 and the output signal VSL are in a feedback loop only during the auto-zero operation of the first-stage amplifier 81. For this reason, a voltage that compensates for the mismatch of the first-stage amplifier 81 is kept in the condenser 51-2, and thus, it is possible to suppress the inversion error in the comparator 31 due to the mismatch such that the inversion error is decreased.

The difference between the first driving method and the second driving method of the comparator 31 will be described with reference to FIG. 12A and FIG. 12B.

In FIG. 12A, a state of performing the auto-zero operation of the first-stage amplifier 81 in the first driving method of the comparator 31 is illustrated, and in FIG. 12B, a state of performing the auto-zero operation of the first-stage amplifier 81 in the second driving method of the comparator 31 is illustrated.

As illustrated in FIG. 12A, in the auto-zero operation of the first-stage amplifier 81 of the comparator 31 in the first driving method, the transistors 61-3 and 61-4 are in the ON state. For this reason, the mismatch ΔVth of the differential amplifier appears as the inversion error ΔVt in the output Vout of the comparator 31.

Meanwhile, as illustrated in FIG. 12B, in the auto-zero operation of the first-stage amplifier 81 of the comparator 31 in the second driving method, the transistors 61-2 and 61-3 are in the ON state, and the voltage that compensates for the mismatch ΔVth of the first-stage amplifier 81 is kept in the condenser 51-2. Therefore, it is possible to avoid the influence of the mismatch ΔVth of the first-stage amplifier 81 to the output Vout of the comparator 31.

Figure 13:
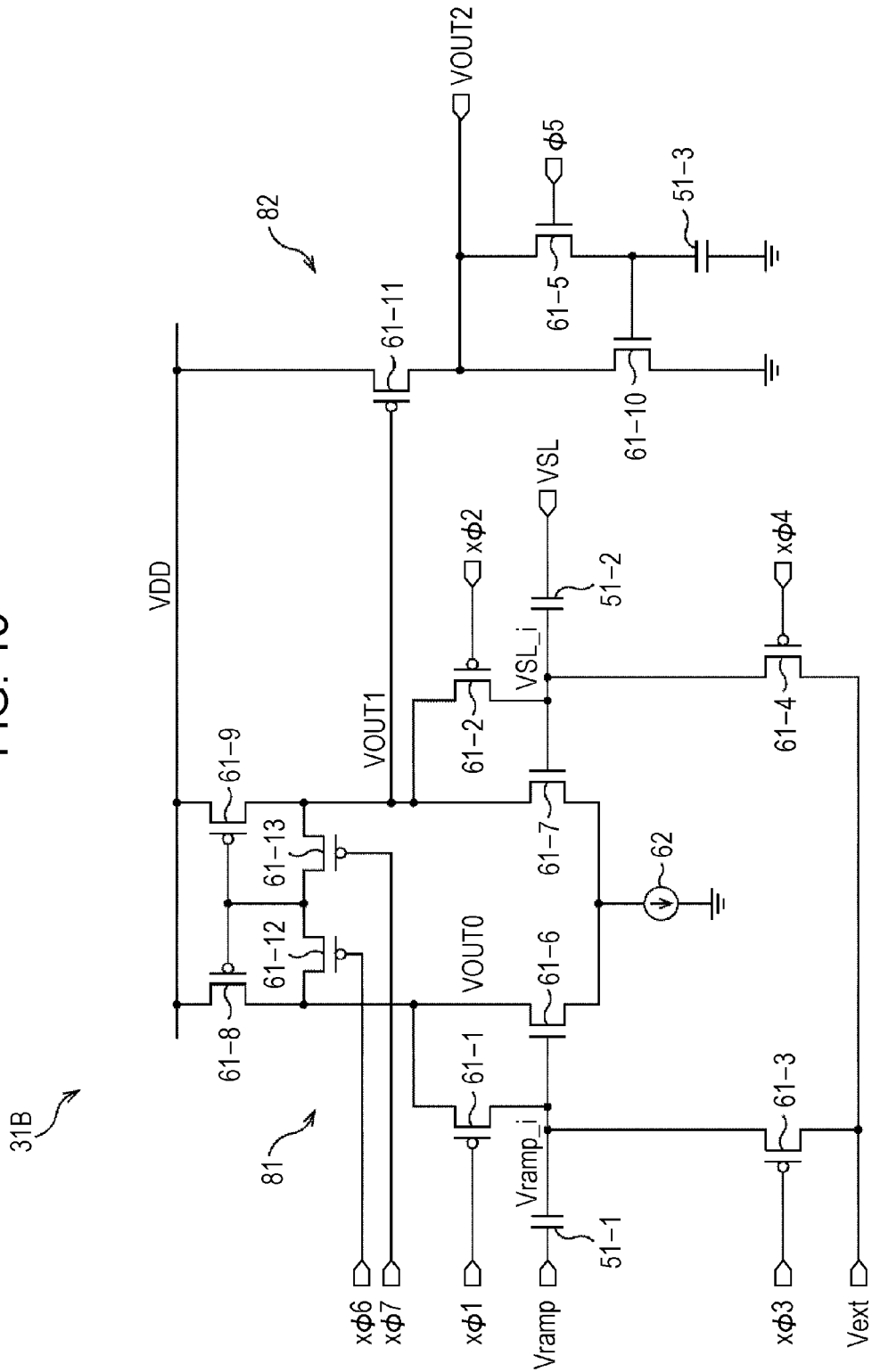
FIG. 13 is a circuit diagram illustrating a configuration example of a comparator to which the present technology is adapted according to a second embodiment.

Next, FIG. 13 is a circuit diagram illustrating a configuration example of the comparator 31 to which the present technology is adapted according to the second embodiment. In the comparator 31B illustrated in FIG. 13, the configurations in common with the comparator 31 in FIG. 4 will be referenced by the same numerals, and the detailed descriptions will not be repeated.

That is, the comparator 31B has a configuration in common with the comparator 31 in FIG. 4 in the point that the comparator 31B includes the condensers 51-1 to 51-3, the transistors 61-1 to 61-11, and the current source 62. The comparator 31B has a different configuration from that of the comparator 31 in FIG. 4 in the point that transistors 61-12 and 61-13 are added and the external apply voltage Vext is supplied to the source electrodes of the transistors 61-3 and 61-4. That is, in driving the comparator 31B, the external apply voltage generation circuit 71 illustrated in FIG. 8 is used.

The transistor 61-12 is connected between the gate electrode and the drain electrode of the transistor 61-8 and a control signal xφ6 from the row scanning unit 15 (FIG. 1) is supplied to the gate electrode of the transistor 61-12. The transistor 61-13 is connected between the gate electrode and drain electrode of the transistor 61-9, and a control signal xφ7 from the row scanning unit 15 is supplied to the gate electrode of the transistor 61-13.

In the comparator 31B configured in this way, it is possible to switch the connection of the gate electrodes of the transistors 61-8 and 61-9 which are active loads of the first-stage amplifier 81 to either of the drain electrode on both sides of the differential amplifier by the transistors 61-12 and 61-13. That is, it is possible to perform the driving of switching the connection by the transistors 61-12 and 61-13 during the auto-zero operation and during the D-phase conversion and P-phase conversion.

Figure 14:
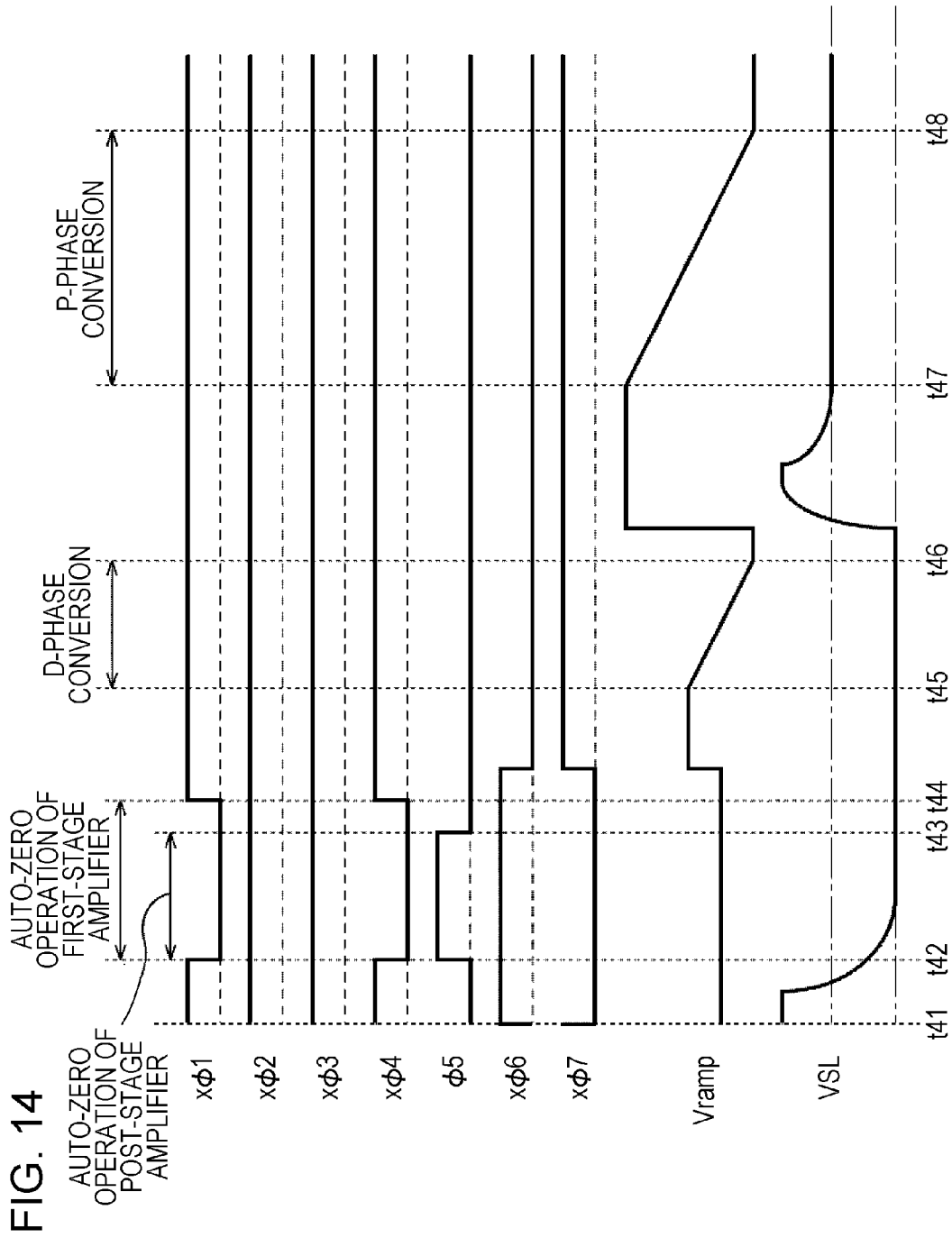
FIG. 14 is a diagram illustrating a timing chart of the comparator.

In FIG. 14, a diagram illustrating a timing chart of the comparator 31B is illustrated.

In FIG. 14, from top to bottom in an order, the control signal xφ1 for controlling the transistor 61-1, the control signal xφ2 for controlling the transistor 61-2, the control signal xφ3 for controlling the transistor 61-3, the control signal xφ4 for controlling the transistor 61-4, the control signal φ5 for controlling the transistor 61-5, the control signal φ6 for controlling the transistor 61-12, the control signal φ7 for controlling the transistor 61-13, the reference signal Vramp for the reference in comparing the voltage level, and the output signal VSL output from the pixel 21 to the vertical signal line 23 are illustrated.

First, at the point in time t41 before performing the auto-zero operation, the control signal φ6 is shifted to the high level from the low level and the control signal φ7 is shifted to the low level from the high level. Accordingly, since an inverted control signal is input to the transistors 61-12 and 61-13, the transistors 61-12 is in the OFF state according to the control signals xφ6 and the transistor 61-13 is in the ON state according to the control signals xφ7. In this way, the gate electrodes of the transistors 61-8 and 61-9 are connected to the drain electrode of the transistor 61-9. Therefore, the amplifier output VOUT1 output to the post-stage amplifier 82 is supplied to the gate electrode of the transistors 61-8 and 61-9 which are the active follower of the first-stage amplifier 81 via the transistor 61-13.

At the point in time t42, the control signal xφ1 and xφ4 are shifted to the low level from the high level, and the control signal φ5 is shifted to the high level from the low level. At this time, the control signals xφ2 and xφ4 remain at the high level. Accordingly, since an inverted control signal is input to the transistors 61-1 and 61-4, the transistors 61-2 and 61-3 are in the ON state according to the control signals xφ1 and xφ4, respectively, and the transistor 61-5 is in the ON state according to the control signal φ5. In this way, the auto-zero operations of the post-stage amplifier 82 and the first-stage amplifier 81 simultaneously start.

That is, the first-stage amplifier 81 comes to have the voltage follower configuration in which the amplifier output VOUT0 by the transistors 61-6 and 61-8, and the internal node Vramp_i in the gate electrode of the transistor 61-6 are in the feedback loop. Here, since the connection of the transistor 61-9 which is the active load of the first-stage amplifier 81 becomes a diode connection, the amplifier output VOUT1 has a value in which the threshold voltage Vthp of the PMOS transistor and the over drive voltage ΔV of the PMOS transistor are subtracted from the power source voltage VDD, that is, VOUT1=VDD−Vthp−ΔV.

Since the amplifier output VOUT1 here has a substantially constant voltage without depending on the internal node VSL_i (=VSL) of the first-stage amplifier 81, a voltage suitable for performing the auto-zero operation of the post-stage amplifier 82 is supplied to the gate electrode of the transistor 61-11. Therefore, it becomes possible that the auto-zero operation of the post-stage amplifier 82 can be performed in parallel with the auto-zero operation of the first-stage amplifier 81.

At the point in time t43, by the control signal φ5 being shifted to low level and the transistor 61-5 being in the OFF state, the auto-zero operation of the post-stage amplifier 82 is completed. At the point in time t44, by the control signal xφ1 and xφ4 being shifted to the high level and the transistors 61-1 and 61-4 being in the OFF state, the auto-zero operation of the first-stage amplifier 81 is completed. During the points in time t43 to t45, the control signal φ6 is shifted to the low level from the high level, and the control signal φ7 is shifted to the high level from the low level. Accordingly, the gate electrode of the transistors 61-8 and 61-9 are switched so as to be connected to the drain electrode of the transistor 61-8. Thereafter, during the points in time t45 to t46, D-phase conversion is performed, and during the period of the points in time t47 to t48, P-phase conversion is performed.

In this way, in the comparator 31B, the auto-zero operation of the first-stage amplifier 81 and the auto-zero operation of the post-stage amplifier 82 are performed in parallel, and thus it is possible to complete the auto-zero operations at one time. Therefore, it is possible for comparator 31B to increase the speed of processing compared to the configuration in which it is necessary to perform the auto-zero operation two times: the auto-zero operation in the first-stage amplifier 81 and then in the post-stage amplifier 82 as described with reference to FIG. 11, for example.

Figure 15:
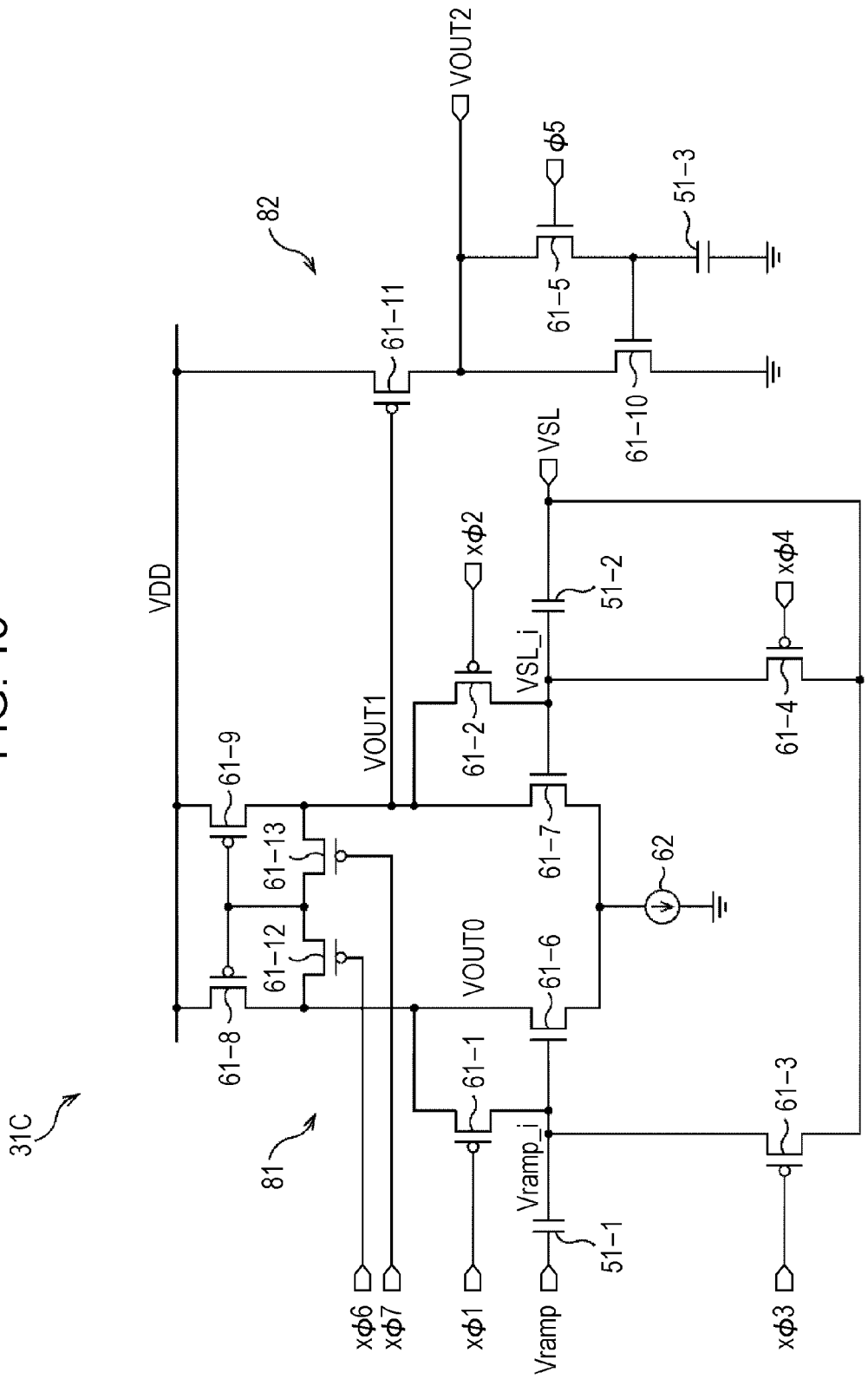
FIG. 15 is a circuit diagram illustrating a configuration example of a comparator to which the present technology is adapted according to a third embodiment.

Next, FIG. 15 is a circuit diagram illustrating a configuration example of the comparator 31 to which the present technology is adapted according to the third embodiment. In the comparator 31C illustrated in FIG. 15, the configurations in common with the comparator 31B in FIG. 13 will be referenced by the same numerals, and the detailed descriptions will not be repeated.

That is, the comparator 31C has a configuration in common with the comparator 31B in FIG. 13 in the point that the comparator 31C includes the condensers 51-1 to 51-3, the transistors 61-1 to 61-13, and the current source 62. The comparator 31C has a different configuration from that of the comparator 31B in FIG. 13 in the point that the source electrode of the transistors 61-3 and 61-4 are connected to the vertical signal line 23, and has a configuration in common with the comparator 31 in FIG. 4.

In this way, in the comparator 31C, the signal level of the output signal VSL supplied via the vertical signal line 23 can be set as the initial voltages of the internal node Vramp_i and the internal node VSL_i in the D-phase first-read drive, as similar to the comparator 31 in FIG. 4. That is, it is possible to configure the comparator 31C so as to have a configuration in which the external apply voltage generation circuit 71 (FIG. 8) is not necessary while the comparator 31B in FIG. 13 has a configuration in which the external apply voltage generation circuit 71 is necessary.

The comparator 31C, as similar to the comparator 31B in FIG. 13, can operate according to the timing chart illustrated in FIG. 14. That is, the comparator 31C has a configuration to include the transistors 61-12 and 61-13, and thus can perform the auto-zero operations of the first-stage amplifier 81 and the auto-zero operation of the post-stage amplifier 82 in parallel, as similar to the comparator 31B in FIG. 13.

Therefore, in the comparator 31C, it is possible to achieve a reduction in power consumption and a size since the external power source is necessary, and to increase the speed by completing the auto-zero operations at one time.

The comparator 31C has a configuration suitable for the purpose of suppressing a gain error in the AD conversion processing. Here, if the capacitance of the condenser 51-1 is C1 and the parasitic capacitance (a parasitic capacitance on wiring, a gate capacitance of the transistor 61-6, a diffusion layer capacitance of the transistor 61-1, and the like) to the internal node Vramp_i of the first-stage amplifier 81 is Cp1, the amplitude of the internal node Vramp_i attenuates at the rate of C/(C1+Cp1) with respect to the reference voltage Vramp (the amplitude decreases). Similarly, if the capacitance of the condenser 51-2 is C2 and the parasitic capacitance to the internal node VSL_i of the first-stage amplifier 81 is Cp2, the attenuation rate of the output signal VSL_is C2/(C2+Cp2).

The capacitance C1 of the condenser 51-1, the capacitance C2 of the condenser 51-2, the parasitic capacitance Cp1 to the internal node Vramp_i of the first-stage amplifier 81, and the parasitic capacitance Cp2 to the internal node VSL_i of the first-stage amplifier 81 depend on the film thickness of the gate oxide film of the transistor 61, the inter-layer film thickness of the metal layer, and the like. Therefore, since the attenuation rate of the reference signal Vramp and the output signal VSL has a uniform distribution in the chip or in the wafer surface, if a difference between the internal node Vramp_i and the internal node VSL_i in one comparator occurs, then the difference becomes the gain error of the comparator. Particularly, in the structure of the column processing unit (FIG. 1) in which a multiple number of comparators are arrayed in parallel, the difference causes a shading of the image in the horizontal direction.

In contrast, the configuration of the comparator 31C adopts a circuit configuration such that the configuration of the internal node Vramp_i and the internal node VSL_i in the gate electrode of the transistors 61-6 and 61-7 that configure the first-stage amplifier 81 becomes bilaterally symmetrical. In this way, even if the capacitance C1 of the condenser 51-1, the capacitance C2 of the condenser 51-2, the parasitic capacitance Cp1 to the internal node Vramp_i of the first-stage amplifier 81, and the parasitic capacitance Cp2 to the internal node VSL_i of the first-stage amplifier 81 have a uniform distribution on the surface, the difference in local (in the same comparator) attenuation rate between the reference signal Vramp and the output signal VSL_is a component of mismatch of each capacitance. Therefore, it is possible to decrease the gain error of the comparator 31C in the column processing unit 17.

In this way, in the comparator 31C, it is possible to suppress the gain error in the AD conversion processing.

Figure 16:
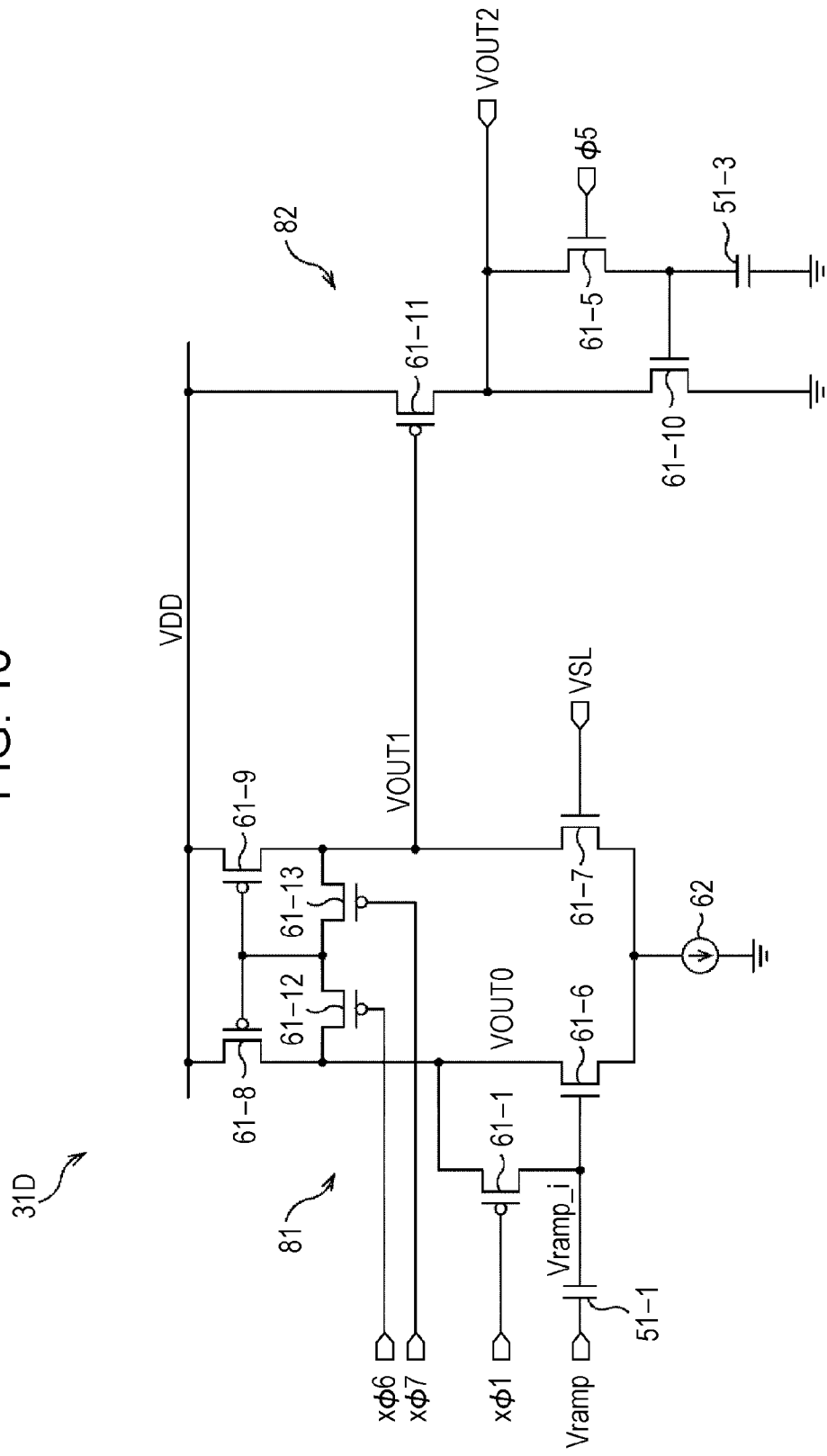
FIG. 16 is a circuit diagram illustrating a configuration example of a comparator to which the present technology is adapted according to a fourth embodiment.

Next, FIG. 16 is a circuit diagram illustrating a configuration example of a comparator 31 to which the present technology is adapted according to the fourth embodiment. In the comparator 31D illustrated in FIG. 16, the configurations in common with the comparator 31C in FIG. 15 will be referenced by the same numerals, and the detailed descriptions will not be repeated.

That is, the comparator 31D has a configuration in common with the comparator 31C in FIG. 15 in the point that the comparator 31D includes the condensers 51-1 and 51-3, the transistors 61-1 and 61-5 to 61-13, and the current source 62. That is, the comparator 31D has a configuration in which the condenser 51-2 and transistors 61-2 to 61-4 are removed from the comparator 31C in FIG. 15.

In the comparator 31D configured in this way, the output signal VSL_is directly supplied to the transistor 61-7 via the vertical signal line 23. Therefore, it is possible to configure the comparator 31D so as to have a configuration in which the external apply voltage generation circuit 71 is not necessary in the D-phase first-read drive, as similar to the comparator 31 in FIG. 4.

The comparator 31D, as similar to the comparator 31B in FIG. 13, can drive according to the timing chart illustrated in FIG. 14. That is, the comparator 31D has a configuration including the transistors 61-12 and 61-13, and thus can perform the auto-zero operations of the first-stage amplifier 81 and the auto-zero operation of the post-stage amplifier 82 in parallel, as similar to the comparator 31B in FIG. 13.

Therefore, in the comparator 31D, it is possible to achieve a reduction in power consumption and a size since the external power source is necessary, and to increase the speed by completing the auto-zero operations at one time.

The comparator 31D has a configuration suitable for the purpose of decreasing the circuit area. That is, the comparator 31D, as described above, has a configuration in which the condenser 51-2 and transistors 61-2 to 61-4 are removed from the configuration of the comparator 31C.

In the configuration of the column processing unit 17 in which a plural number of comparators 31 are arrayed in parallel, and particularly, the ratio of the area occupied by the condenser 51-1 and 51-2 connected to the input terminal of the comparator 31 becomes comparatively large in the entire circuit of the column processing unit 17. Therefore, by adopting configuration of the comparator 31D to remove the condenser 51-2, it is possible to contribute greatly to reducing the overall area of the solid-state imaging device 11.

The comparator 31C in FIG. 15 and the comparator 31D in FIG. 16 can perform not only the D-phase first-read drive as described above with reference to FIG. 3, but also the drive of reading the D-phase (signal level) after reading the P-phase (reset level) first (hereinafter, appropriately referred to as P-phase first-read drive).

Figure 17:
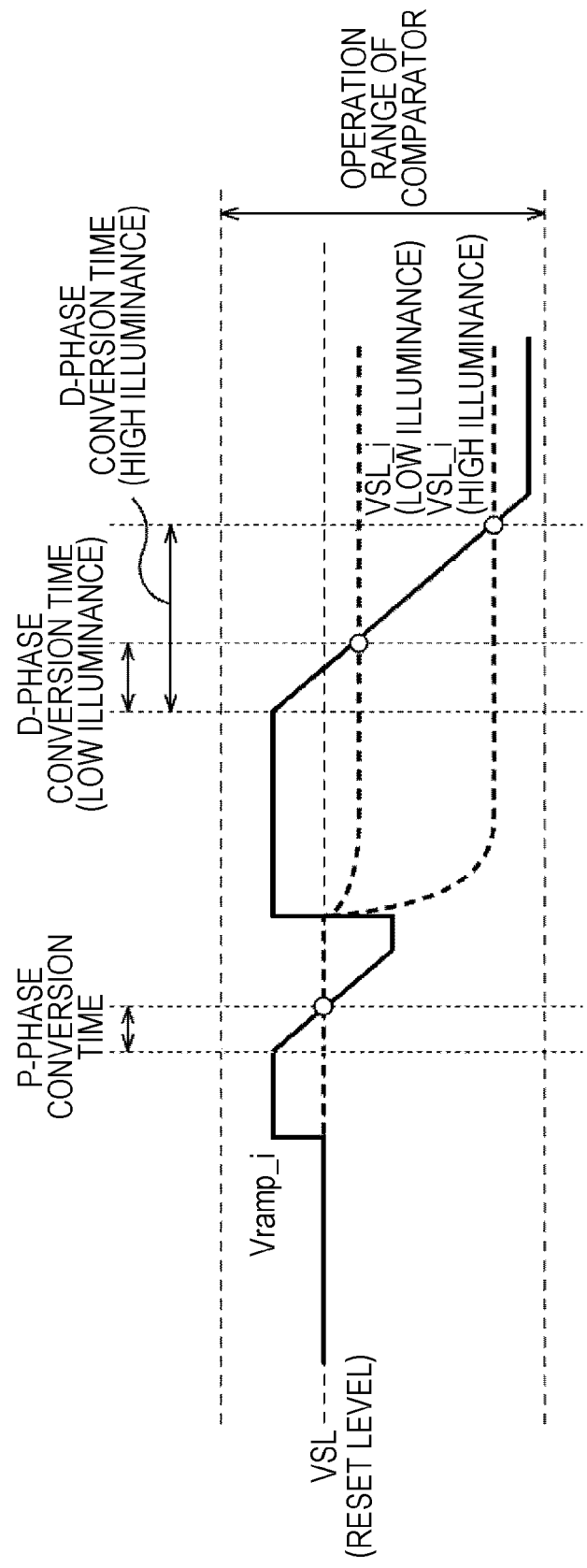
FIG. 17 is a diagram illustrating an internal voltage waveform of the comparator in a case where a P-phase first-read drive is performed.

In FIG. 17, an internal voltage waveform of the comparator 31C or the comparator 31D in a case where the P-phase first-read drive is performed is illustrated.

As illustrated in FIG. 17, in the P-phase first-read drive, the initial voltages of the internal node Vramp_i and the internal node VSL_i of the comparator 31C or the comparator 31D are automatically determined according to the signal level of the output signal VSL supplied via the vertical signal line 23. Therefore, the range of the output signal VSL supplied via the vertical signal line 23 automatically fits the operable range of the comparator 31C or the comparator 31D, and the AD conversion can be performed as normal.

In this way, in the comparator 31C or the comparator 31D, the AD conversion can be performed by the same drive with respect to both the D-phase first-read drive and the P-phase first-read drive. Therefore, it is possible to simplify the drive control of the comparator 31C or the comparator 31D.

The solid-state imaging device 11 as described above can be adapted to various electronic apparatuses including, for example, an imaging system such as a digital still camera and a digital video camera, a mobile phone having an imaging function, or another apparatus having an imaging function.

Figure 18:
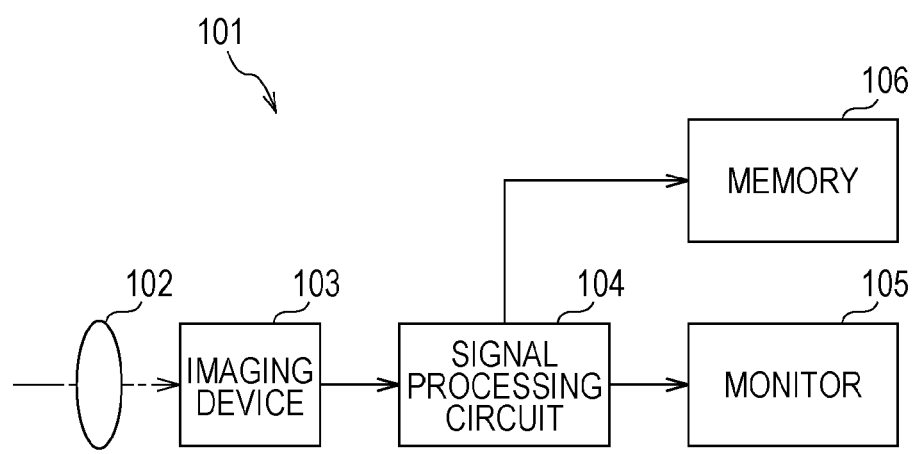
FIG. 18 is a block diagram illustrating a configuration example of an imaging apparatus that is mounted on an electronic apparatus.

FIG. 18 is a block diagram illustrating a configuration example of the imaging apparatus that is mounted on the electronic apparatus.

As illustrated in FIG. 18, an imaging apparatus 101 is configured to include an optical system 102, an imaging device 103, a signal processing circuit 104, a monitor 105, and a memory 106, and can capture a still image and a moving image.

The optical system 102 is configured to have one or a plurality of lenses, and guides an image light (incident light) from the subject to the imaging device 103, and forms an image on the light receiving surface (sensor unit) of the imaging device 103.

As the imaging device 103, the solid-state imaging device 11 described above is adapted. In the imaging device 103, electrons are accumulated according to the image formed on the light receiving surface via the optical system 102 for a certain period. Then, a signal according to the electrons accumulated in the imaging device 103 is supplied to the signal processing circuit 104.

The signal processing circuit 104 implements various signal processing with respect to the pixel signals output from the imaging device 103. An image (image data) obtained by the signal processing implemented by the signal processing circuit 104 is supplied to the monitor 105 to be displayed or supplied to the memory 106 to be stored (recorded).

In the imaging apparatus 101 configured in this way, by adapting the configuration of the solid-state imaging device 11 described above, it is possible to increase the speed of the AD conversion processing.

The present technology may also have a configuration as follows.

(1) A comparator including: a first amplifying unit that includes a differential pair configured with a pair of transistors which are first and second transistors, and amplifies a difference of signals input to each of the gate electrodes of the first and second transistors, to output; a second amplifying unit that amplifies the signal output from the first amplifying unit; a third transistor that connects the first transistor to a power source voltage; a fourth transistor that connects the second transistor to the power source voltage; a fifth transistor that connects a connection point of gate electrodes of the third transistor and the fourth transistor to a drain of the third transistor; and a sixth transistor that connects a connection point of gate electrodes of the third transistor and the fourth transistor to a drain of the fourth transistor.

(2) The comparator according to (1), in which an auto-zero operation that sets an initial voltage in the circuits of the first amplifying unit and the second amplifying unit is performed in parallel.

(3) The comparator according to (1) or (2), in which the connection by the fifth transistor and the sixth transistor is switched to one of the connections to the drain of the third transistor or to a drain of the fourth transistor, during a period of performing the auto-zero operations of the first amplifying unit and the second amplifying in parallel and during a period of converting the pixel signal having the signal level to a digital signal and converting the pixel signal having the reset level to the digital signal.

(4) The comparator according to any one of (1) to (3), further including: a first condenser that is disposed between a gate electrode of the first transistor and a reference signal supply unit which supplies a reference signal, the voltage value of which drops at a constant gradient; a second condenser that is disposed between a gate electrode of the second transistor and a pixel signal wiring which reads out a pixel signal from a pixel that outputs the pixel signal having a signal level corresponding to charges generated by a photoelectric conversion; a seventh transistor that connects a connection point of the gate electrode of the first transistor and the first condenser to the pixel signal wiring; and an eighth transistor that connects a connection point of the gate electrode of the second transistor and the second condenser to the pixel signal wiring.

(5) The comparator according to (4), in which, in a case where a drive of reading out a pixel signal having a reset level in which the charges are reset is performed after firstly reading out the pixel signal having the signal level from the pixel, when the auto-zero operation of the first amplifying unit is performed, a voltage of a pixel signal supplied via the pixel signal wiring is supplied to each of the gate electrodes of the first and the second transistors, with the seventh and the eighth transistors being in an ON state.

(6) The comparator according to any one of (1) to (5), further including: a first condenser that is disposed between a gate electrode of the first transistor and a reference signal supply unit which supplies a reference signal, the voltage value of which drops at a constant gradient; a second condenser that is disposed between a gate electrode of the second transistor and a pixel signal wiring which reads out a pixel signal from a pixel that outputs the pixel signal having a signal level corresponding to charges generated by a photoelectric conversion; a ninth transistor that connects a connection point of the gate electrode of the first transistor and the first condenser to a wiring that supplies a predetermined external apply voltage; and a tenth transistor that connects a connection point of the gate electrode of the second transistor and the second condenser to a wiring that supplies a predetermined external apply voltage.

(7) The comparator according to (6), in which, in a case where a drive of reading out a pixel signal having a reset level in which the charges are reset is performed after firstly reading out the pixel signal having the signal level from the pixel, when the auto-zero operation of the first amplifying unit is performed, the external apply voltage is supplied to each of the gate electrodes of the first and the second transistors, with the ninth and the tenth transistors being in the ON state.

It should be understood by those skilled in the art that various modifications, combinations, sub-combinations and alterations may occur depending on design requirements and other factors insofar as they are within the scope of the appended claims or the equivalents thereof.

What is claimed is:

1. A comparator comprising:
    a gate of a first transistor electrically connected directly to a gate of a second transistor;
    a third transistor that is controllable by a first control signal to electrically disconnect the gate of the second transistor from a drain of the first transistor and electrically connect the gate of the second transistor to the drain of the first transistor; and
    a fourth transistor that is controllable by a second control signal to electrically disconnect the gate of the first transistor from a drain of the second transistor and electrically connect the gate of the first transistor directly to the drain of the second transistor, wherein a drain of the fourth transistor is electrically connected directly to the gate of the first transistor.

2. The comparator according to claim 1, wherein the third transistor is controllable by the first control signal to electrically disconnect the drain of the first transistor from the gate of the first transistor and electrically connect the drain of the first transistor to the gate of the first transistor.

3. The comparator according to claim 1, wherein the fourth transistor is controllable by the second control signal to electrically disconnect the drain of the second transistor from the gate of the second transistor and electrically connect the drain of the second transistor to the gate of the second transistor.

4. The comparator according to claim 1, further comprising:
    a source of the first transistor electrically connected directly to a source of the second transistor.

5. The comparator according to claim 1, further comprising:
    a drain of a fifth transistor electrically connected directly to the drain of the first transistor.

6. The comparator according to claim 5, further comprising:
    a sixth transistor that is controllable by a third control signal to electrically disconnect the drain of the first transistor from a gate of the fifth transistor and electrically connect the drain of the first transistor to the gate of the fifth transistor.

7. The comparator according to claim 6, further comprising: a condenser between a reference signal supply unit and the gate of the fifth transistor.

8. The comparator according to claim 6, further comprising:
    a source of a seventh transistor electrically connected directly to a source of the fifth transistor.

9. The comparator according to claim 8, further comprising:
    a drain of the seventh transistor electrically connected directly to the drain of the second transistor.

10. The comparator according to claim 8, further comprising:
    a gate of an eighth transistor electrically connected directly to the drain of the seventh transistor.

11. The comparator according to claim 10, further comprising:
a drain of a ninth transistor electrically connected directly to a source of the eighth transistor.

12. The comparator according to claim 11, further comprising:
a gate of a tenth transistor electrically connected directly to a source of the ninth transistor.

13. The comparator according to claim 12, wherein the tenth transistor is controllable by a fourth control signal to electrically disconnect ground from the source of the eighth transistor and electrically disconnect the ground to the source of the eighth transistor.

14. A solid-state imaging device comprising:
the comparator according to claim 8; and
a pixel configured to output a pixel signal to a gate of the seventh transistor.

15. The solid-state imaging device according to claim 14, wherein the pixel is configured to receive incident light and generate a signal charge by photoelectrically converting the incident light into the signal charge.

16. The solid-state imaging device according to claim 15, wherein a signal level the pixel signal corresponds to an amount of the signal charge.

17. An electronic apparatus comprising:
the solid-state imaging device according to claim 14; and
a signal processing circuit configured to perform signal processing on image data from the solid-state imaging device,
wherein the solid-state imaging device is configured to convert the pixel signal into the image data.

18. The comparator according to claim 1, wherein first transistor and the fourth transistor are transistors of a same conductivity-type.

19. The comparator according to claim 18, wherein the fourth transistor is controllable by the second control signal to electrically disconnect the gate of the first transistor from the drain of the second transistor and electrically connect the gate of the first transistor directly to the drain of the second transistor.

20. The comparator according to claim 1, wherein first transistor and the fourth transistor are PMOS transistors.

* * * * *